United States Patent
Hayakawa et al.

(10) Patent No.: US 8,817,009 B2
(45) Date of Patent: Aug. 26, 2014

(54) METHOD FOR DRIVING DISPLAY DEVICE AND LIQUID CRYSTAL DISPLAY DEVICE

(75) Inventors: Masahiko Hayakawa, Atsugi (JP); Kenichi Wakimoto, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 498 days.

(21) Appl. No.: 13/005,763

(22) Filed: Jan. 13, 2011

(65) Prior Publication Data

US 2011/0175895 A1    Jul. 21, 2011

(30) Foreign Application Priority Data

Jan. 20, 2010 (JP) .................................. 2010-010419

(51) Int. Cl.
G09G 5/00 (2006.01)
G09G 3/36 (2006.01)

(52) U.S. Cl.
CPC .............. *G09G 3/36* (2013.01); *G09G 3/3655* (2013.01); *G09G 2330/021* (2013.01); *G09G 2320/041* (2013.01); *G09G 2320/103* (2013.01); *G09G 2340/0435* (2013.01)
USPC ........... 345/212; 345/204; 345/206; 345/208; 345/209; 345/211

(58) Field of Classification Search
CPC . G09G 3/36; G09G 3/3645; G09G 2320/041; G09G 2320/103; G09G 2330/021
USPC ............... 345/76, 77, 87–102, 204–214, 589, 345/630, 690; 348/51, 744; 315/169.3
See application file for complete search history.

(56) References Cited

U.S. PATENT DOCUMENTS 5,717,421 A * 2/1998 Katakura et al. .............. 345/101
5,731,856 A    3/1998 Kim et al.
(Continued)

FOREIGN PATENT DOCUMENTS

EP    1296174 A    3/2003
EP    1737044 A    12/2006
(Continued)

OTHER PUBLICATIONS

Tsuda.K et al., "Ultra Low Power Consumption Technologies for Mobile TFT-LCDs," IDW '02: Proceedings of the 9th International Display Workshops, Dec. 4, 2002, pp. 295-298.
(Continued)

*Primary Examiner* — Prabodh M Dharia
(74) *Attorney, Agent, or Firm* — Eric J. Robinson; Robinson Intellectual Property Law Office, P.C.

(57) ABSTRACT

The still image display mode includes a first period of writing the data of the image signal from the driver circuit portion into the pixel; after the first period, a second period of stopping supply of a signal or voltage for operating the driver circuit portion to the driver circuit portion; and after the second period, a third period of restarting the supply of a signal or voltage for operating the driver circuit portion to the driver circuit portion and writing the data of the image signal into the pixel from the driver circuit portion, so that the pixel keeps displaying a still image. A length of a period from the stop of the supply of the signal for operating the driver circuit portion to the driver circuit portion to the restart is set in accordance with a temperature of the display device.

22 Claims, 15 Drawing Sheets

(56) References Cited

U.S. PATENT DOCUMENTS

| | | | |
|---|---|---|---|
| 5,744,864 A | 4/1998 | Cillessen et al. | |
| 5,754,154 A * | 5/1998 | Katakura et al. | 345/97 |
| 5,796,381 A | 8/1998 | Iwasaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,937,224 B1 * | 8/2005 | Miyachi | 345/102 |
| 7,002,543 B2 * | 2/2006 | Miyajima et al. | 345/94 |
| 7,049,190 B2 | 5/2006 | Takeda et al. | |
| 7,061,014 B2 | 6/2006 | Hosono et al. | |
| 7,061,459 B2 * | 6/2006 | Koizumi | 345/94 |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,321,353 B2 | 1/2008 | Tsuda et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,639,228 B2 | 12/2009 | Nagata | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0060660 A1 * | 5/2002 | Yamasaki | 345/98 |
| 2002/0093473 A1 | 7/2002 | Tanaka et al. | |
| 2002/0132454 A1 | 9/2002 | Ohtsu et al. | |
| 2002/0180673 A1 | 12/2002 | Tsuda et al. | |
| 2002/0186213 A1 * | 12/2002 | Koizumi | 345/208 |
| 2003/0058543 A1 * | 3/2003 | Sheedy et al. | 359/630 |
| 2003/0063078 A1 | 4/2003 | Hanari et al. | |
| 2003/0098860 A1 | 5/2003 | Nakamura et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0189627 A1 * | 9/2004 | Shirasaki et al. | 345/204 |
| 2005/0017302 A1 | 1/2005 | Hoffman | |
| 2005/0140632 A1 | 6/2005 | Tsuda et al. | |
| 2005/0199959 A1 | 9/2005 | Chiang et al. | |
| 2005/0237294 A1 * | 10/2005 | Miyachi | 345/102 |
| 2005/0253833 A1 * | 11/2005 | Teshirogi et al. | 345/204 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0146002 A1 | 7/2006 | Nagata | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0256141 A1 * | 11/2006 | Maruyama et al. | 345/690 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0182700 A1 | 8/2007 | Baba et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0055218 A1 | 3/2008 | Tsuda et al. | |
| 2008/0073653 A1 | 3/2008 | Iwasaki | |
| 2008/0083950 A1 | 4/2008 | Pan et al. | |
| 2008/0094009 A1 * | 4/2008 | Koyama et al. | 315/307 |
| 2008/0106191 A1 | 5/2008 | Kawase | |
| 2008/0122769 A1 * | 5/2008 | Takaki | 345/87 |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0284929 A1 | 11/2008 | Kimura | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179832 A1 * | 7/2009 | Kohno et al. | 345/76 |
| 2009/0219295 A1 | 9/2009 | Reijnaerts | |
| 2009/0278122 A1 | 11/2009 | Hosono et al. | |
| 2009/0280600 A1 | 11/2009 | Hosono et al. | |
| 2009/0289964 A1 * | 11/2009 | Miyachi | 345/690 |
| 2009/0327777 A1 | 12/2009 | Vasquez et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0049511 A1 | 3/2011 | Yano et al. | |
| 2011/0090204 A1 | 4/2011 | Yamazaki et al. | |
| 2011/0115839 A1 | 5/2011 | Takahashi et al. | |
| 2011/0169882 A1 * | 7/2011 | Dallas et al. | 345/691 |
| 2012/0086739 A1 * | 4/2012 | Akimoto et al. | 345/690 |

FOREIGN PATENT DOCUMENTS

| | | | |
|---|---|---|---|
| EP | 2226847 A | 9/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 09-068696 | 3/1997 | |
| JP | 11-505377 | 5/1999 | |
| JP | 2000-044236 A | 2/2000 | |
| JP | 2000-132135 A | 5/2000 | |
| JP | 2000-150900 A | 5/2000 | |
| JP | 2001-312253 A | 11/2001 | |
| JP | 2002-076356 A | 3/2002 | |
| JP | 2002-207462 | 7/2002 | |
| JP | 2002-289859 A | 10/2002 | |
| JP | 2003-086000 A | 3/2003 | |
| JP | 2003-086808 A | 3/2003 | |

(56) References Cited

FOREIGN PATENT DOCUMENTS

| JP | 2004-103957 A | 4/2004 |
|---|---|---|
| JP | 2004-273614 A | 9/2004 |
| JP | 2004-273732 A | 9/2004 |
| JP | 3766926 | 4/2006 |
| JP | 2006-189663 | 7/2006 |
| JP | 2007-304234 A | 11/2007 |
| JP | 2008-033066 | 2/2008 |
| JP | 2009-075500 A | 4/2009 |
| JP | 2009-300722 A | 12/2009 |
| WO | WO-2004/114391 | 12/2004 |
| WO | WO-2009/091013 | 7/2009 |

OTHER PUBLICATIONS

Fortunatq.E et al., "Wide-Bandgap High-Mobility Zno Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector with Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties,", SID Digest '09 : SID International Symposium Digest of Technical Papers, May 31, 2009, pp. 983-985.

Sakata.J et al., "Development of 4.0-IN. Amoled Display with Driver Circuit Using Amorphous IN-GA-ZN-Oxide TFTS,", IDW '09 : Proceedings of the 16th International Display Workshops, 2009, pp. 689-692.

Park.J et al., "Amorphous Indium-Gallium-Zinc Oxide TFTS and their Application for Large Size Amoled,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.

Osada.T et al., "Development of Driver-Integrated Panel Using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

Ohara.H et al., "21.3:4.0 IN. QVGA Amoled Display Using IN-GA-ZN-Oxide TFTS with a Novel Passivation Layer,", SID Digest '09 : SID International Symposium Digest of Technical Papers, May 31, 2009, pp. 284-287.

Miyasaka.M, "SUFTLA Flexible Microelectronics on their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] At Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review.A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters) , Sep. 1, 2003, vol. 83, No. 9, pp. 1755-1757.

International Search Report (Application No.PCT/JP2010/073649) Dated Mar. 8, 2011.

Written Opinion (Application No.PCT/JP2010/073649) Dated Mar. 8, 2011.

\* cited by examiner 6603
6602
6601

6603   6609   6610
6605            6606
6608            6607
        6604

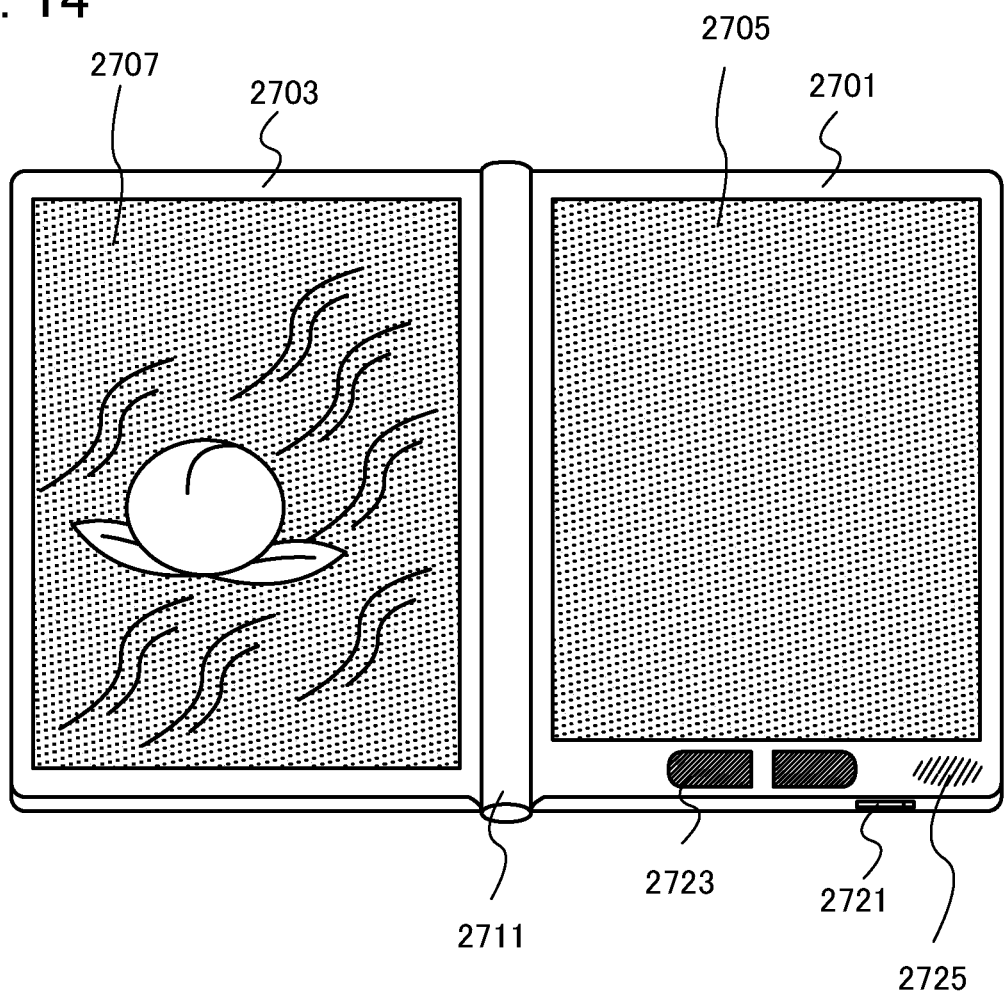

METHOD FOR DRIVING DISPLAY DEVICE AND LIQUID CRYSTAL DISPLAY DEVICE

TECHNICAL FIELD

An embodiment of the present invention relates to a method for driving a display device. Another embodiment of the present invention relates to a liquid crystal display device.

BACKGROUND ART

Display devices such as liquid crystal display devices have been applied in a wide range of fields from large-sized display devices such as TV sets to small-sized display devices such as mobile phones, and those with higher added value have been developed. In recent years, in view of improvement in convenience of mobile devices for example, development of display devices with low power consumption has attracted attention.

For example, Patent Document 1 discloses a technique for reducing the power consumption of a liquid crystal display device, in which all signal lines are electrically disconnected from a signal line driver circuit and a high impedance state is formed in order to keep the voltage of each signal line constant in a break period during which no scan line and no signal line are selected.

Non-Patent Document 1 discloses a structure for reducing the power consumption of a liquid crystal display device, in which the refresh rate in moving image display is made to be different from that in still image display. Further in Non-Patent Document 1, in order to prevent perception of a flicker due to fluctuation of a voltage applied to a liquid crystal element which is caused by switching of a signal between a break period and a scanning period in the case of displaying a still image, a technique for preventing the fluctuation of a voltage applied to a liquid crystal element, in which AC signals with the same phase are applied to a signal line and a common electrode also in the break period, is disclosed.

REFERENCE

Patent Document

[Patent Document 1] Japanese Published Patent Application No. 2001-312253

Non-Patent Document

[Non-Patent Document 1] Kazuhiko Tsuda et al., IDW'02, pp. 295-298

DISCLOSURE OF INVENTION

However, in the above-mentioned driving methods, a structure and operation of a driver circuit which supplies a signal to a scan line or a signal line of the liquid crystal display device are complicated, so that power consumption of the liquid crystal display device cannot be reduced enough.

Further, in the case where the break period during which no scan line and no signal line are selected is provided as in Patent Document 1, the interval between writing operations into pixels becomes long, which may cause the voltage applied to a liquid crystal element be largely decreased due to leakage current of a transistor or parasitic capacitance in some cases. Large decrease in the voltage applied to the liquid crystal element degrades the display quality; for example, display with a predetermined gray scale level cannot be performed.

Further in the above liquid crystal display devices, the luminance changes due to its own temperature change, and even in the case of displaying a still image, the change in luminance gradually becomes larger as the time passes, thereby degrading the display quality.

In view of the above problems, an object of an embodiment of the present invention is to reduce power consumption without a complicated operation in a driver circuit of a display device. Another object of an embodiment of the present invention is to reduce degradation in the display quality.

In an embodiment of the present invention, a moving image display mode and a still image display mode are set, and even when an operation for supplying a signal or voltage for operating a driver circuit to the driver circuit is stopped in the still image display mode, an image written right before the stop of the operation is held as a still image. Then, data of an image signal is rewritten in order that the displayed image is held as a still image, whereby the pixel keeps displaying the still image. In addition, the holding period of the still image is set in accordance with the temperature of the display device.

Further in an embodiment of the present invention, a mode in which a moving image is displayed at a relatively high frequency (e.g., at 60 Hz or higher) and a still image display mode or a simple moving-image reproducing mode in which data of an image signal is written into a pixel at a relatively low frequency (e.g., at 1 Hz or lower) are set. The interval between writing operations of image signal data in the still image display mode or the simple moving-image reproducing mode is set in accordance with the temperature of the display device.

An embodiment of the present invention is a method for driving a display device which includes a driver circuit portion to which an image signal is input and a pixel whose display state is controlled by writing of data of the image signal from the driver circuit portion and has a moving image display mode and a still image display mode. The still image display mode includes a first period of writing the data of the image signal from the driver circuit portion into the pixel; after the first period, a second period of stopping supply of a signal or voltage for operating the driver circuit portion to the driver circuit portion; and after the second period, a third period of restarting the supply of a signal or voltage for operating the driver circuit portion to the driver circuit portion and writing the data of the image signal into the pixel from the driver circuit portion, so that the pixel keeps displaying a still image. The length of a period from the stop of the supply of the signal or voltage for operating the driver circuit portion to the driver circuit portion to the restart in the second period and the third period is set in accordance with the temperature of the display device.

Another embodiment of the present invention is a liquid crystal display device including a display control circuit to which an image signal, a start signal, a clock signal, a first control signal which is a signal based on the image signal, a second control signal which is a signal based on a temperature of the liquid crystal display device, and a power supply voltage are input, and which selectively starts or stops output of the input image signal, start signal, clock signal, and power supply voltage on the basis of the first control signal and the second control signal; a driver circuit portion whose start or stop of operation is controlled by the image signal, the start signal, the clock signal, and the power supply voltage which are sequentially input from the display control circuit; and a pixel whose display state is controlled by the data of the image signal written from the driver circuit portion.

Another embodiment of the present invention is a liquid crystal display device including a memory circuit to which an image signal is input and which sequentially stores a state of the input image signal as data; a comparison circuit which compares data of the image signal corresponding to images in successive frame periods among the data of the image signal stored in the memory circuit and generates a first control signal based on a comparison result; a selection circuit which reads out the data of the image signal stored in the memory circuit on the basis of the first control signal and outputs the read-out data of the image signal as a data signal; a temperature detection circuit which detects a temperature of the liquid crystal display device and generates a second control signal in accordance with the detected temperature; a display control circuit to which a start signal, a clock signal, the first control signal, the second control signal, and a power supply voltage are input, to which the image signal is input from the selection circuit, and which selectively starts or stops output of the input image signal, start signal, clock signal, and power supply voltage on the basis of the first control signal and the second control signal; and a pixel whose display state is controlled by the data of the image signal written from the driver circuit portion.

With an embodiment of the present invention, power consumption at the time of displaying a still image can be reduced. In addition, degradation in the display quality can be reduced.

BRIEF DESCRIPTION OF DRAWINGS

In the accompanying drawings:

FIG. 14 illustrates an example of the structure of a liquid crystal display device in Embodiment 6.

BEST MODE FOR CARRYING OUT THE INVENTION

Hereinafter, embodiments of the present invention will be described in detail with reference to the drawings. Note that the present invention is not limited to the following description and it will be easily understood by those skilled in the art that modes and details can be modified in various ways without departing from the spirit and the scope of the present invention. Therefore, the present invention should not be construed as being limited to the description in the embodiments below.

(Embodiment 1)

In this embodiment, a liquid crystal display device in which the timing to start or stop operation of a driver circuit is controlled in accordance with the ambient temperature will be described as an example of a display device.

Figure 1:
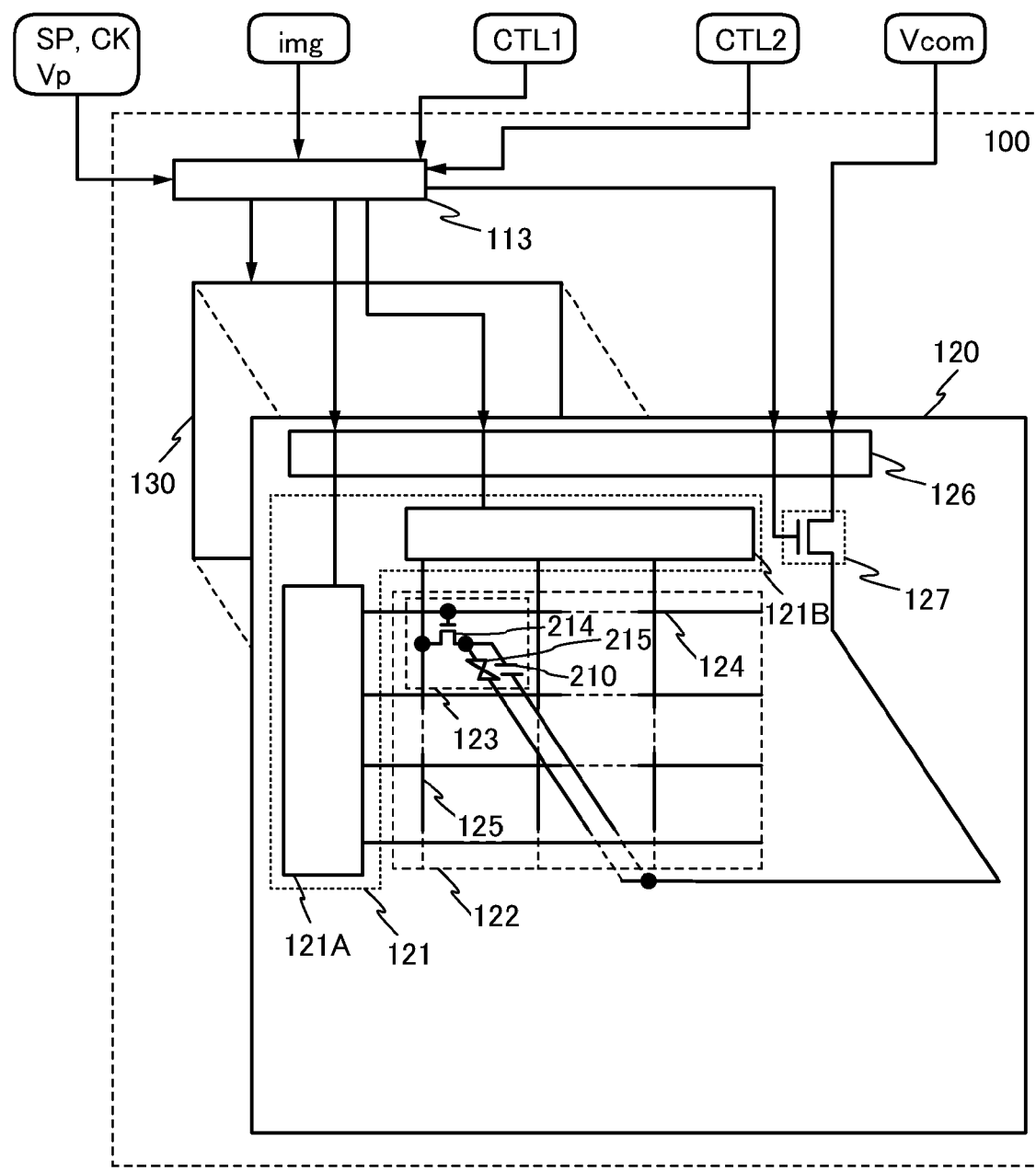
FIG. 1 illustrates an example of the structure of a display device in Embodiment 1.

First, an example of the structure of the liquid crystal display device of this embodiment will be described with reference to FIG. 1. FIG. 1 is a block diagram illustrating an example of the structure of a liquid crystal display device.

A liquid crystal display device 100 illustrated in FIG. 1 includes a display control circuit 113 in which output of a signal or voltage is controlled on the basis of a control signal CTL1 and a control signal CTL2, and a display panel 120 whose display operation is controlled by the display control circuit 113.

Note that the term "voltage" generally means a difference between potentials at two points (also referred to as a potential difference). However, in some cases, values of both a voltage and a potential are represented using volt (V) in a circuit diagram or the like, so that it is difficult to discriminate between them. Thus, in this specification, a potential difference between a potential at one point and a reference potential is sometimes referred to as a voltage at the point unless otherwise specified.

Further, the display panel 120 includes a driver circuit portion 121, a pixel portion 122, scan lines 124, and image signal lines 125. The driver circuit portion 121 includes a driver circuit 121A and a driver circuit 121B. The pixel portion 122 includes a plurality of pixels 123.

An image signal img and a signal or voltage for operating the driver circuit portion 121 (e.g., a start signal SP, a clock signal CK, a control signal CTL1, a control signal CTL2, and a power supply voltage Vp) are input (supplied) to the display control circuit 113. The display control circuit 113 has a function of selectively outputting the image signal img, the start signal SP, the clock signal CK, and the power supply voltage Vp on the basis of the control signal CTL1 and the control signal CTL2. The power supply voltage Vp is input from an external device, for example.

For example, the image signal img may be a signal whose polarity is inverted per frame period by, for example, dot inversion driving, source line inversion driving, gate ling inversion driving, frame line inversion driving, or the like. In the case where the image signal img is an analog signal, the analog signal may be inverted into a digital signal with an A/D converter or the like and the digital signal may be used as the image signal img.

Examples of the start signal SP are a start signal GSP that is output to the driver circuit 121A and a start signal SSP that is output to the driver circuit 121B. Note that start signals corresponding to the start signal GSP and the start signal SSP may each be a plurality of signals. The start signal SP is input from an external device, for example.

Examples of the clock signal CK are a clock signal GCK that is output to the driver circuit 121A and a clock signal SCK that is output to the driver circuit 121B. Note that clock signals corresponding to the clock signal GCK and the clock signal SCK may each be a plurality of signals. The clock signal CK is input from an external device, for example.

The control signal CTL1 is a signal for controlling operation of the display control circuit 113 in accordance with the image signal img. An example of data included in the control signal CTL1 is an instruction or information that directs the timing or the number of times to output the image signal img, the start signal SP, the clock signal CK, and the power supply voltage Vp from the display control circuit 113 to the driver circuit portion 121. The control signal CTL1 is generated as appropriate in accordance with the image signal img, for example. The generated data of the control signal CTL1 may be stored in a memory circuit or the like in advance and may be read out from the memory circuit as appropriate.

The control signal CTL2 is a signal for controlling operation of the display control circuit 113 in accordance with the temperature of the liquid crystal display device 100. An example of data included in the control signal CTL2 is an instruction or information that directs, in accordance with the temperature of the liquid crystal display device 100, the optimal timing or the optimal number of times to output the image signal img, the start signal SP, the clock signal CK, and the power supply voltage Vp from the display control circuit 113 to the driver circuit portion 121. The control signal CTL2 is generated as appropriate in accordance with the temperature of the liquid crystal display device, for example. Here, the temperature means the temperature inside the liquid crystal display device 100 or the temperature in an environment where the liquid crystal display device 100 is placed, for example.

Figure 2:
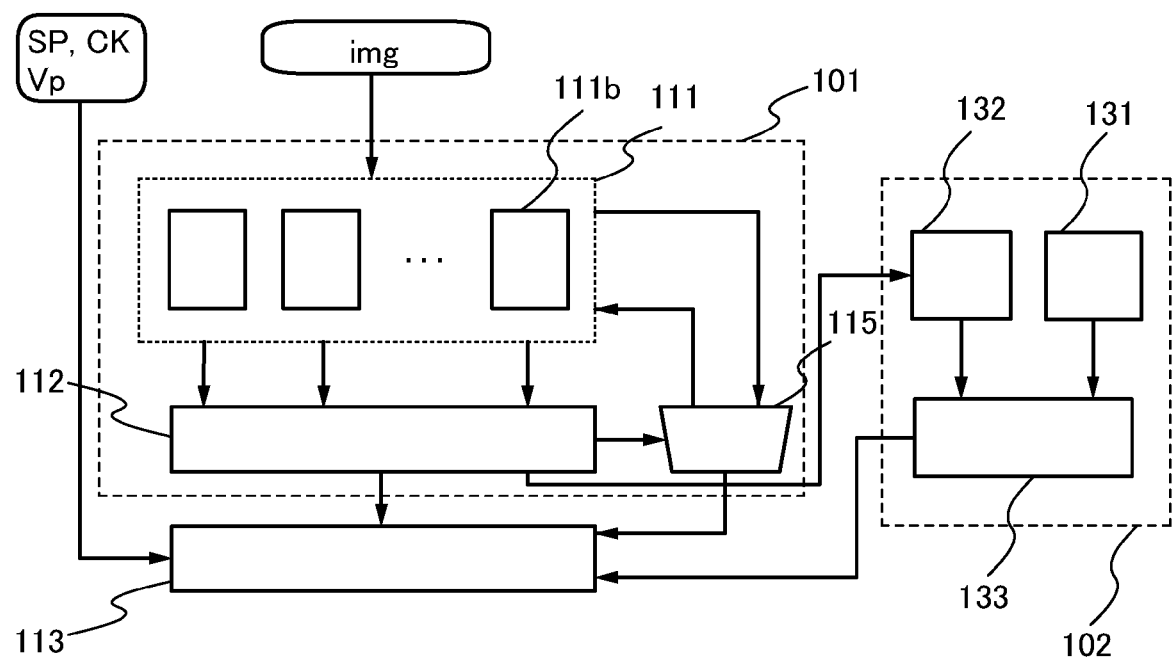
FIG. 2 illustrates a structure of an image processing circuit, a correction circuit, and a display control circuit.

An image processing circuit may be provided in the liquid crystal display device illustrated in FIG. 1 to generate the control signal CTL1, and a correction circuit may be provided in the liquid crystal display device illustrated in FIG. 1 to generate the control signal CTL2. The structure of the image processing circuit, the correction circuit, and the display control circuit 113 in the case of providing the image processing circuit and the correction circuit will be described with reference to FIG. 2. FIG. 2 illustrates an example of the structure of an image processing circuit, a correction circuit, and a display control circuit.

An image processing circuit 101 illustrated in FIG. 2 includes a memory circuit 111 which stores data of the image signal img (also referred to as an image data), a comparison circuit 112 which compares a plurality of image data stored in the memory circuit 111, and a selection circuit 115 in which readout of the image data from the memory circuit 111 is controlled by the comparison circuit 112.

The memory circuit 111 is a circuit to which the image signal img is input and which has a function of sequentially storing the input image signals img as data. The memory circuit 111 includes a plurality of frame memories for storing data of the image signal img corresponding to images in a plurality of frame periods. A frame memory 111b is illustrated in FIG. 2 in order to conceptually indicate a memory region for one frame period. The number of frame memories of the memory circuit 111 is not particularly limited as long as the memory circuit 111 can store data of the image signal img corresponding to images in a plurality of frame periods. Note that the frame memory is formed using a memory element such as a dynamic random access memory (DRAM) or a static random access memory (SRAM).

The comparison circuit 112 reads out the data of the image signal img corresponding to images in successive frame periods from the memory circuit 111, compares the read-out data of the image signal img, generates a control signal CTL1 which is a signal based on the comparison result, and outputs the generated control signal CTL1 to the display control circuit 113 and the selection circuit 115. By the comparison of the image data in the comparison circuit 112, it is judged whether the data of the image signal img corresponding to the images in the successive frame periods are data for displaying a moving image or data for displaying a still image.

Note that a moving image refers to images which are recognized as an image that is moving by the human eye by switching a plurality of images which are time-divided into a plurality of frame periods at high speed.

In contrast, unlike the moving image and a partial moving image, a still image refers to images recognized, by the human eye, as an image that does not change in successive frame periods, for example, during an n-th frame period (n is a natural number) and an (n+1)-th frame period, even when a plurality of images which are time-divided into a plurality of frame periods are switched at high speed.

In the example described above, the structure in which the comparison circuit 112 compares the data of the image signal img corresponding to the images in the successive frame periods so that whether the compared images are a moving image or a still image is judged has been described. However, without limitation to the above example, the liquid crystal display device of this embodiment may have a structure in which an image signal img which has been determined to be for a moving image or a still image in advance may be input from the outside.

The selection circuit 115 has a function of reading out the data of the image signal img stored in the memory circuit 111 on the basis of the control signal CTL1 and selectively outputting the read-out data of the image signal img as a data signal. Note that operation of the selection circuit 115 may be set on the basis of the detection standards of the comparison circuit 112.

The selection circuit 115 is constituted by a circuit including a plurality of switches, for example. As the switches, transistors can be used, for example.

A correction circuit 102 includes a temperature detection circuit 131, a counting circuit 132, and a counting value comparison circuit 133.

The temperature detection circuit 131 has a function of generating a temperature data signal TML in accordance with the detected temperature and further generating a data signal CNT1 of a reference count value with the use of the temperature data signal TML. The temperature detection circuit 131 includes a temperature sensor which generates the temperature data signal TML, for example. As the temperature sensor, a thermocouple, a resistance temperature sensor, a thermistor, an IC temperature sensor, a magnetic temperature sensor, an infrared temperature sensor, or the like can be used. As the temperature sensor, a sensor that utilizes temperature characteristics of a transistor or the like can also be used.

The counting circuit 132 has a function of counting the number of successive frame periods corresponding to images that are judged as a still image in the comparison circuit 112 and outputting a data signal CNT2 of the counted value.

The counting value comparison circuit 133 has a function of comparing data of the data signal CNT2 of the counted value from the counting circuit 132 with data of the data signal CNT1 of the reference count value, generating a control signal CTL2 based on the comparison result, and outputting the generated control signal CTL2 to the display control circuit 113.

The reference count value can be set on the basis of the temperature data TML generated by the temperature sensor. For example, count values corresponding to each temperature are set and a correction data table of the count value corresponding to the temperature is made. The temperature detection circuit 131 reads out the data of the count value corresponding to the temperature data TML generated by the temperature sensor from the data table, and uses the read-out data of the count value as the data of the data signal CNT1 of the reference count value. Thus, the timing to output a signal or voltage for operating the driver circuit portion 121 (the image signal img, the start signal SP, the clock signal CK, and the power supply voltage Vp) can be corrected in accordance with the temperature. Further, the liquid crystal display device of this embodiment may have a structure in which the correction data table of the count value is stored in a separate memory or the like as data and the stored correction data table is read out and used as necessary.

The structure of the correction circuit 102 is not limited to the structure illustrated in FIG. 2 as long as the temperature can be detected by the temperature detection circuit 131 and the control signal CTL2 can be generated using data of the detected temperature.

The following is an example of the operation of the image processing circuit 101 and the correction circuit 102.

First, an image signal img is input to the memory circuit 111.

The memory circuit 111 sequentially stores data of the input image signals img and sequentially outputs the data of the stored image signals img to the comparison circuit 112.

Further, the comparison circuit 112 compares the data of the image signal img, which are input from the memory circuit 111 and correspond to images in successive frame periods, checks whether there is a difference between the compared data of the image signal img, and judges whether the images corresponding to the compared data of the image signal img are a moving image or a still image.

For example, in the case where a difference is detected between the data of the image signal img corresponding to the images in successive frame periods, the comparison circuit 112 judges that the images corresponding to the compared data of the image signal img are a moving image, and then outputs a control signal CTL1 based on the comparison result to the display control circuit 113 and the selection circuit 115.

On the other hand, in the case where no difference is detected between the data of the image signal img corresponding to the images in successive frame periods, the comparison circuit 112 judges that the images corresponding to the compared data of the image signal img are a still image, and then outputs a control signal CTL1 based on the comparison result to the display control circuit 113 and the selection circuit 115.

Note that the detection criterion of a difference may be set so that when the difference detected by the comparison circuit 112 exceeds a certain value, it can be judged that the difference is detected.

Further, the selection circuit 115 reads out the data of the image signal img from the memory circuit 111 on the basis of the control signal CTL1 that is input from the comparison circuit 112, and outputs the read-out data of the image signal img as a data signal to the display control circuit 113.

For example, in the case where the images corresponding to the compared data of the image signal img are judged as a moving image in the comparison circuit 112, the selection circuit 115 reads out the data of the image signal img from the memory circuit 111 and outputs the read-out data of the image signal img as a data signal to the display control circuit 113.

In contrast, in the case where the images corresponding to the compared data of the image signal img are judged as a still image in the comparison circuit 112, the selection circuit 115 stops the output of the image signal img to the display control circuit 113.

The temperature detection circuit 131 detects the temperature of the liquid crystal display device and generates a temperature data signal TML corresponding to the detected temperature. Further, the temperature detection circuit 131 reads out the data of the count value corresponding to the temperature data TML generated by the temperature detection circuit 131 from the data table, and outputs the read-out data of the count value as a data signal CNT1 of the reference count value to the counting value comparison circuit 133.

The counting circuit 132 counts the number of successive frame periods corresponding to images that are judged as a still image and outputs data of the counted value as a data signal CNT2 of the counted value to the counting value comparison circuit 133.

The counting value comparison circuit 133 compares data of the data signal CNT2 of the counted value from the counting circuit 132 with data of the data signal CNT1 of the reference count value, generates a control signal CTL2 based on the comparison result, and outputs the generated control signal CTL2 to the display control circuit 113. In addition, when the counted value of the counting circuit 132 reaches a reference count value, the image signal img, the start signal SP, the clock signal CK, and the power supply voltage Vp are output from the display control circuit 113 to the driver circuit portion 121 in accordance with the control signal CTL2. This is an example of the operation of the image processing circuit 101 and the correction circuit 102.

The liquid crystal display device illustrated in FIG. 1 is provided with a light source portion 130 which supplies light to the display panel 120.

The light source portion 130 has a function of supplying light to the display panel 120 and includes a light source control circuit and a light source, for example. The light source may include a combination of components which are selected in accordance with the usage of the liquid crystal display device. For example, in the case of displaying full-color images, a light source that can emit light of three primary colors can be used as a light source. Alternatively, a light-emitting element (e.g., an LED) that emits white light can be used as the light source, for example. As illustrated in FIG. 1, the lighting state of the light source portion 130 can be controlled by the display control circuit 113. Although the light source portion 130 need not necessarily be controlled by the display control circuit 113, the control of the light source portion 130 by the display control circuit 113 enables the light source to be turned off as necessary; therefore, power consumption can be reduced. For example, a backlight or a side light can be used as the light source, for example.

Next, the structure of the display panel 120 will be described below.

The driver circuit 121A has a function of a scan line driver circuit that controls the scan lines 124 which select the pixels 123 to which the image signal img is output. Through a terminal portion 126, the power supply voltage Vp, the start signal GSP, and the clock signal GCK are selectively input to the driver circuit 121A.

The driver circuit 121B has a function of a signal line driver circuit that controls whether the image signal img is output to the pixel 123. Through the terminal portion 126, the image signal img, the power supply voltage Vp, the start signal SSP, and the clock signal SCK are selectively input to the driver circuit 121B.

For example, the driver circuit 121A and the driver circuit 121B can have a structure including a shift register; the shift register can be formed using a transistor, for example.

The plurality of pixels 123 is provided in matrix and is surrounded by the scan lines 124 and the image signal lines 125. In the liquid crystal display device in FIG. 1, the scan lines 124 are extended from the driver circuit 121A, and the image signal lines 125 are extended from the driver circuit 121B.

Furthermore, an example of a circuit structure of the pixel 123 will be described below.

The pixel 123 includes a transistor 214, a capacitor 210, and a liquid crystal element 215.

Note that in this specification, the transistor refers to a field-effect transistor including at least a source, a drain, and a gate.

The source means the whole of a source electrode and a source wiring or part thereof. A conductive layer having a function of both a source electrode and a source wiring is referred to as a source in some cases without distinction between the source electrode and the source wiring.

The drain means the whole of a drain electrode and a drain wiring or part thereof. A conductive layer having a function of both a drain electrode and a drain wiring is referred to as a drain in some cases without distinction between the drain electrode and the drain wiring.

The gate means the whole of a gate electrode and a gate wiring or part thereof. A conductive layer having a function of both a gate electrode and a gate wiring is referred to as a gate in some cases without distinction between the gate electrode and the gate wiring.

Further, a source and a drain of a transistor may interchange with each other depending on the structure, the operating condition, and the like of the transistor; therefore, it is difficult to define which is the source or the drain. Therefore, in this document (the specification, the claims, the drawings, or the like), one of them is referred to as one of the source and the drain, and the other is referred to as the other of the source and the drain, in some cases.

One of the source and the drain of the transistor 214 is electrically connected to the image signal line 125, and the gate of the transistor 214 is electrically connected to the scan line 124.

The liquid crystal element 215 has a first terminal and a second terminal. The first terminal is electrically connected to the other of the source and the drain of the transistor 214. The liquid crystal element 215 can include a pixel electrode which functions as part of or the whole of the first terminal, a common electrode which functions as part of or the whole of the second terminal, and a liquid crystal layer whose transmittance of light is changed by application of voltage between the pixel electrode and the common electrode.

Note that the pixel electrode can have a structure including a region transmitting visible light and a region reflecting visible light. The region transmitting visible light in the pixel electrode transmits light incident from the light source portion 130, and the region reflecting visible light in the pixel electrode reflects light incident through the liquid crystal layer.

The pixel electrode is preferably provided over a first substrate, and the common electrode is preferably provided over a second substrate. Here, the second substrate over which the common electrode is provided is electrically connected to the first substrate through a common connection portion. For example, the common connection portion can be formed using a conductive particle in which an insulating sphere is covered with a metal film. A plurality of common connection portions may be provided between the first substrate and the second substrate.

The shape of the pixel electrode and the common electrode may be a shape including various opening patterns.

Examples of a liquid crystal that can be used for the liquid crystal layer are a nematic liquid crystal, a cholesteric liquid crystal, a smectic liquid crystal, a discotic liquid crystal, a thermotropic liquid crystal, a lyotropic liquid crystal, a low-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

The resistivity of a liquid crystal material used for the liquid crystal layer is $1\times10^{12}\Omega\cdot cm$ or more, preferably $1\times10^{13}\Omega\cdot cm$ or more, and further preferably $1\times10^{14}\Omega\cdot cm$ or more. Note that the resistivity in this specification is measured at 20° C. In the case where a liquid crystal display device is formed using the liquid crystal material, the resistivity of a portion serving as a liquid crystal element may be $1\times10^{11}\Omega\cdot cm$ or more, or further $1\times10^{12}\Omega\cdot cm$ or more in some cases, because of an impurity mixed into the liquid crystal layer from an alignment film, a sealant, or the like.

As the resistivity of the liquid crystal material is larger, the leakage current of the liquid crystal layer can be reduced and the decrease over time of the voltage applied to the liquid crystal element in the display period can be reduced. As a result, the display period of the pixel 123 corresponding to one-time writing of the image data can be extended, so that the frequency of writing the image data into the pixel 123 can be decreased, which leads to a reduction of power consumption of the liquid crystal display device.

The following modes are examples of a method for driving a liquid crystal that can be used in the liquid crystal element: a TN (twisted nematic) mode, an STN (super twisted nematic) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and the like.

The capacitor 210 has a first terminal and a second terminal. The first terminal is electrically connected to the other of the source and the drain of the transistor 214. The capacitor 210 has a function of a storage capacitor, and can include a first electrode which functions as part of or the whole of the first terminal, a second electrode which functions as part of or the whole of the second terminal, and a dielectric layer in which electric charge is accumulated by application of voltage between the first electrode and the second electrode. The capacitance of the capacitor 210 may be set in consideration of the off-state current of the transistor 214. In this embodiment, it is sufficient if a storage capacitor having a capacitance which is ⅓ or less, preferably ⅕ or less of the capacitance of the liquid crystal element 215 (also referred to as liquid crystal capacitance) in each pixel is provided. Further, the capacitor 210 is not necessarily provided, and a structure without the capacitor 210 may be employed. Without the capacitor 210, the aperture ratio of the pixel 123 can be increased.

Furthermore, the liquid crystal display device of this embodiment can have a structure including a transistor 127 as illustrated in FIG. 1.

The transistor 127 turns on or off under the control of the display control circuit 113 and thereby functions as a control transistor which controls whether to supply a common potential Vcom to the common electrode of the liquid crystal element 215. The common potential Vcom is input to one of the source and the drain of the transistor 127, and a control signal is input to the gate of the transistor 127 from the display control circuit 113. The other of the source and the drain of the transistor 127 is electrically connected to the second terminal of the liquid crystal element 215. Note that the transistor 127 may be formed on the same substrate as the driver circuit portion 121 or the pixel portion 122 or on a different substrate. By turning on or off, the transistor 127 controls whether to output the common potential Vcom to the second terminal of the capacitor 210.

The common potential Vcom is a potential set with respect to the potential of the image signal img and may be a ground potential, for example. The common potential Vcom is input from an external device, for example.

Here, a transistor that can be used as a transistor in the liquid crystal display device of this embodiment (e.g., a transistor of the display panel) will be described.

As the transistor that can be used in the liquid crystal display device of this embodiment, a transistor including an oxide semiconductor layer having a function as a channel formation layer can be used, for example. The oxide semiconductor layer having a function of a channel formation layer in the transistor is an intrinsic (i-type) or substantially intrinsic semiconductor layer which is obtained by removing hydrogen, which is an n-type impurity, and purifying the oxide semiconductor layer so that impurities other than main components of the oxide semiconductor are not contained therein as much as possible. In other words, the transistor including the oxide semiconductor layer described in this embodiment has a feature in that the oxide semiconductor layer is formed to be i-type (intrinsic) or close thereto not by adding an impurity to the oxide semiconductor layer but by removing an impurity such as hydrogen or water as much as possible and thereby purifying the oxide semiconductor layer.

The purification means at least one of the following concepts: removal of hydrogen from an oxide semiconductor layer as much as possible; and reduction of defects, which are caused by oxygen deficiency in an oxide semiconductor layer, by supply of oxygen to the oxide semiconductor layer.

As the oxide semiconductor, a four-component metal oxide, a three-component metal oxide, or a two-component metal oxide can be used, for example. As the four-component metal oxide, an In—Sn—Ga—Zn—O-based metal oxide or the like can be used, for example. As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example. As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Sn—O-based metal oxide can be used. Further, as the oxide semiconductor, an In—O-based metal oxide, a Sn—O-based metal oxide, a Zn—O-based metal oxide, or the like can be used. The metal oxide that can be used as the oxide semiconductor may contain $SiO_2$.

As the oxide semiconductor, a material represented by $InMO_3(ZnO)$, (m is larger than 0) can be used. Here, M represents one or more metal elements selected from Ga, Al, Mn, and Co. For example, Ga, Ga and Al, Ga and Mn, Ga and Co, and the like can be given as M. An oxide semiconductor whose composition formula is represented by $InMO_3(ZnO)_m$ where Ga is included as M is also referred to as the In—Ga—Zn—O oxide semiconductor.

Furthermore, the bandgap of the oxide semiconductor used as the oxide semiconductor layer is 2 eV or more, preferably 2.5 eV or more, and further preferably 3 eV or more, which reduces the number of carriers generated by thermal excitation to a negligible level. Further, the amount of impurity such as hydrogen which serves as a donor is reduced to a certain amount or less so that the carrier concentration is less than $1 \times 10^{14}/cm^3$, preferably $1 \times 10^{12}/cm^3$ or less. That is, the carrier concentration of the oxide semiconductor layer is reduced to zero or substantially zero.

In a transistor including the above-described oxide semiconductor layer, the off-state current density per a channel width of 1 μm can be very small; for example, the off-state current density can be less than or equal to 10 aA/μm ($1 \times 10^{-17}$ A/μm), preferably less than or equal to 1 aA/μm ($1 \times 10^{-18}$ A/μm), further preferably less than or equal to 10 zA/μm ($1 \times 10^{-20}$ A/μm), and still further preferably less than or equal to 1 zA/μm ($1 \times 10^{-21}$ A/μm).

For example, in the case where the transistor including the above-described oxide semiconductor layer is used as the transistor 214, the display period of an image corresponding to one-time writing of image data can be made long. Therefore, the interval between writing operations of image data can be made long. For example, the writing interval of image data can be increased to 10 seconds or longer, preferably 30 seconds or longer, and further preferably 1 minute or longer. As the interval between writing operations of image data is made longer, power consumption can be further reduced.

Figure 3:
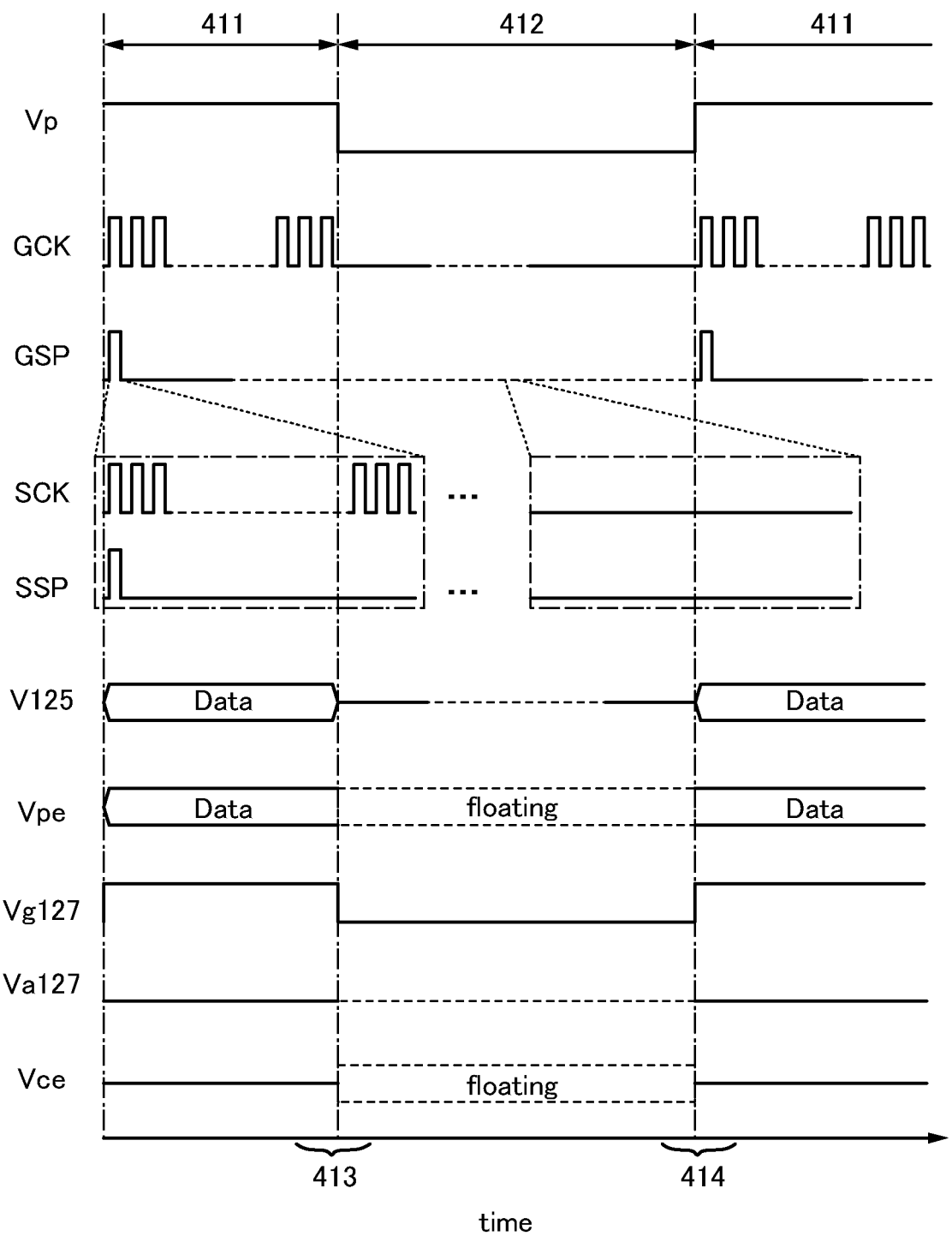
FIG. 3 is a timing chart showing an example of operation of the display device illustrated in FIG. 1.

Next, an example of operation of the liquid crystal display device illustrated in FIG. 1 will be described with reference to FIG. 3. FIG. 3 is a timing chart of an example of the operation of the liquid crystal display device in this embodiment, and shows waveforms of a power supply voltage Vp, a clock signal GCK, a start signal GSP, a clock signal SCK, a start signal SSP, a potential of the image signal line 125 (shown as V125), a potential of the pixel electrode in the liquid crystal element 215 (shown as Vpe), a potential of the gate of the transistor 127 (shown as Vg127), a potential of the other of the source and the drain of the transistor 127 (shown as Va127), and a potential of the common electrode of the liquid crystal element 215 (shown as Vice). In the timing chart of FIG. 3, the start signal GSP is a pulse signal corresponding to the vertical synchronization frequency, and the start signal SSP is a pulse signal corresponding to one-gate selection period. In addition, the clock signal GCK and the clock signal SCK are simple rectangular waves in the timing chart of FIG. 3, for convenience.

In an example of the operation of the liquid crystal display device illustrated in FIG. 1, operation in a period 411 and operation in a period 412 can be considered. The period 411 is a frame period in which an image signal for displaying a moving image is written, and the period 412 is a frame period in which a still image is displayed. An example of the operation in each period will be described below. A mode for displaying a moving image is called a moving-image display mode, and a mode for displaying a still image is called a still-image mode. The still-image mode also includes a mode where part of a moving image is displayed as a still image (also referred to as a simple moving-image reproducing mode).

In the period 411, the image signal img, the power supply voltage Vp, the start signal GSP, the start signal SSP, the clock signal GCK, the clock signal SCK, the control signal CTL1, and the control signal CTL2 are input to the display control circuit 113. On the basis of the control signal CTL1 and the control signal CTL2, the display control circuit 113 outputs the input power supply voltage Vp, the start signal GSP, and the clock signal GCK to the driver circuit 121A, and outputs the image signal img, the power supply voltage Vp, the start signal SSP, and the clock signal SCK to the driver circuit 121B. Further in the period 411, the display control circuit 113 outputs a control signal CTL127 for turning on the transistor 127 to the gate of the transistor 127. Then, the transistor 127 turns on, and the potential of the common electrode becomes equivalent to the potential of the common potential Vcom.

Further, the driver circuit 121A starts operating in response to the input start signal GSP and clock signal GCK and outputs a scan signal to the scan line 124. The driver circuit 121B starts operating in response to the input start signal SSP and clock signal SCK and outputs the image signal img to the image signal line 125.

Further in the pixel 123, the transistor 214 turns on or off in accordance with the potential of the scan line 124. When the transistor 214 is on, the potential of the pixel electrode is equivalent to that of the pixel signal line 125. The light transmittance of the liquid crystal element 215 is set in accordance with the voltage applied between the pixel electrode and the common electrode. Thus, data of the image signal img is written into the pixel 123 and the pixel 123 is brought into a display state.

In the period 412, the display control circuit 113 sequentially stops the ouput of the power supply voltage Vp, the start signal GSP, and the clock signal GCK to the driver circuit 121A, and sequentially stops the output of the power supply voltage Vp, the start signal SSP, and the clock signal SCK to the driver circuit 121B, on the basis of the control signal CTL1 and the control signal CTL2. Note that it is not always necessary to stop the output of the power supply voltage Vp, the start signal GSP, and the clock signal GCK to the driver circuit 121A in the period 412. Further in the period 412, the display control circuit 113 outputs the control signal CTL127 for turning off the transistor 127 to the gate of the transistor 127. Then, the transistor 127 turns off, and the common electrode is brought into a floating state.

Further, since operation of the driver circuit 121B is stopped and the image signal img is not input thereto, output of a signal to the pixel 123 is stopped.

Further in the pixel 123, the transistor 214 turns off in accordance with the potential of the scan line 124, and the pixel electrode is brought into a floating state. Then, the pixel 123 holds the display state of the period 411, so that the displayed image is maintained as a still image.

In this manner, in the liquid crystal display device illustrated in FIG. 1, display of the still image can be held in a plurality of successive frame periods by making the pixel electrode and the common electrode of the liquid crystal element 215 in a floating state in the period 412, without additional application of voltage between the pixel electrode and the common electrode in the liquid crystal element 215.

As a transistor in the liquid crystal display device illustrated in FIG. 1, a transistor having a small off-state current is used; accordingly, a phenomenon in which the voltage applied between the pixel electrode and the common electrode of the liquid crystal element is decreased over time can be prevented from occurring. Therefore, the supply of a signal or voltage for operating a driver circuit to the driver circuit can be stopped in a period of displaying a still image, whereby power consumption can be reduced.

Figure 4A:
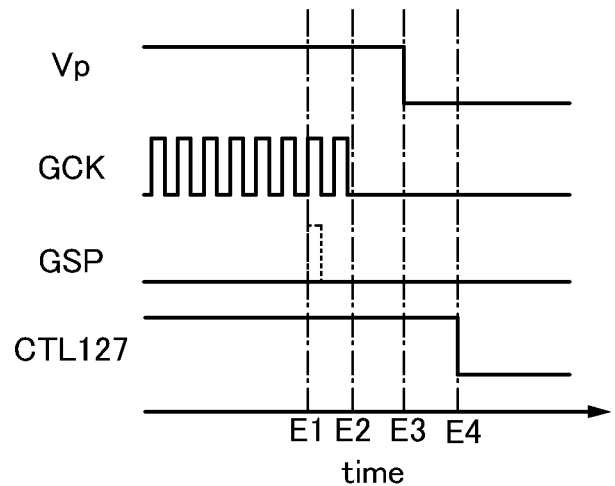
FIGS. 4A and 4B are timing charts showing an example of operation of the display device illustrated in FIG. 1.
Figure 4B:
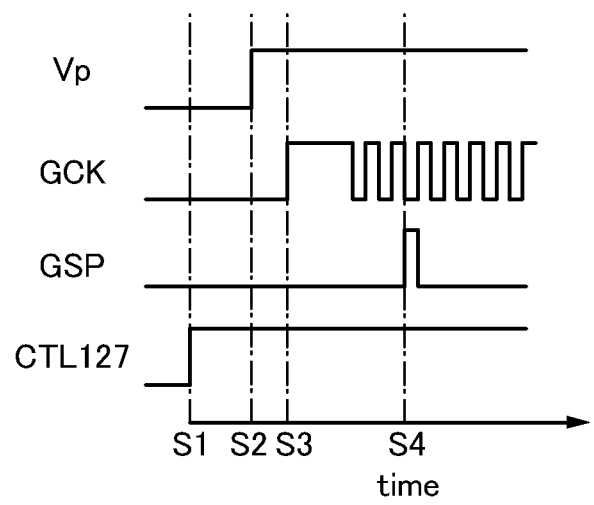

Furthermore, an example of operation of the display control circuit 113 in a first image switching period (a period 413 in FIG. 3) and a second image switching period (a period 414 in FIG. 3) will be described with reference to FIGS. 4A and 4B. FIGS. 4A and 4B are timing charts of an example of the operation of the liquid crystal display device illustrated in FIG. 1, showing an example of waveforms of the power supply voltage Vp, the start signal GSP, the clock signal GCK, and the control signal CTL127 for controlling the transistor 127.

First in the period 413, the display control circuit 113 stops the output of the start signal GSP (E1 in FIG. 4A, a first step). After a pulse is output from the last stage of a shift register, the output of the clock signal GCK is stopped (E2 in FIG. 4A, a second step). Then, the output of the power supply voltage Vp is stopped (E3 in FIG. 4A, a third step). Next, the potential of the control signal CTL127 is set so as to turn off the transistor 127 (E4 in FIG. 4A, a fourth step).

In the above-described manner, the operation of the driver circuit 121A, for example, the output of a signal or voltage for operating the driver circuit 121A to the driver circuit 121A can be stopped, without causing a malfunction of the driver circuit 121A. A malfunction when the display is switched from a moving image to a still image generates noises, and the waveform of the image signal fluctuates because of the noises. The prevention of a malfunction of a driver circuit enables a still image to be displayed with little image deterioration.

Without limitation to the above-described method, the output of a signal or voltage for operating the driver circuit 121B (the power supply voltage Vp, the start signal SSP, and the clock signal SCK) to the driver circuit 121B can be stopped in a manner similar to that of the driver circuit 121A.

Further in the period 414, the display control circuit 113 sets the potential of the control signal CTL127 at such a potential as to turn on the transistor 127 (S1 in FIG. 4B, a first step). Then, the output of the power supply voltage Vp is restarted (S2 in FIG. 4B, a second step). Next, the potential of a wiring to which a clock signal is input is set to a value equivalent to the potential in a high level of the clock signal GCK, and then the output of the clock signal GCK is restarted (S3 in FIG. 4B, a third step). Next, the output of the start signal GSP is restarted (S4 in FIG. 4B, a fourth step).

In the above-described manner, the operation of the driver circuit 121A, for example, the output of a signal or voltage for operating the driver circuit 121A to the driver circuit 121A can be restarted, without causing a malfunction.

Without limitation to the above-described method, the output of a signal or voltage for operating the driver circuit 121B (the power supply voltage Vp, the start signal SSP, and the clock signal SCK) to the driver circuit 121B can be restarted in a manner similar to that of the driver circuit 121A.

Figure 5:
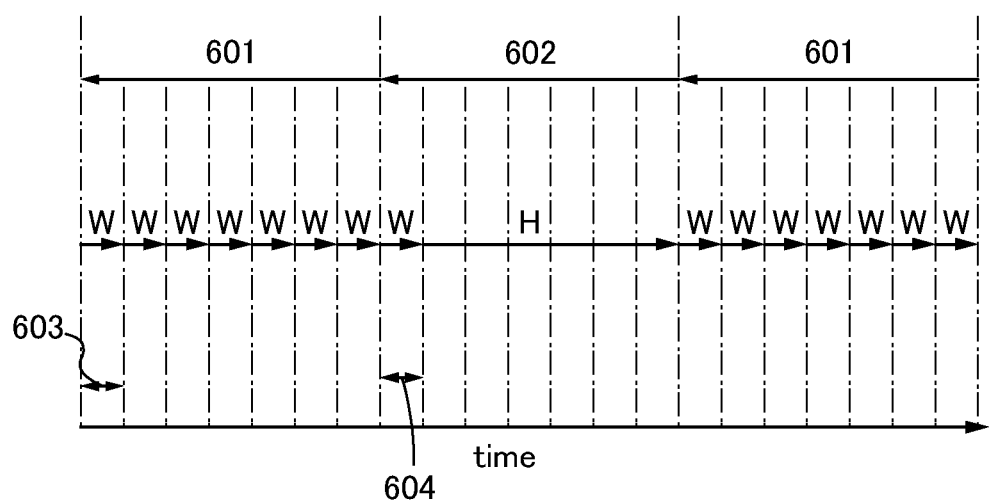
FIG. 5 is a timing chart showing an example of operation of the display device illustrated in FIG. 1.

FIG. 5 shows the frequency of writing an image signal per frame period, in a period 601 in which a moving image is displayed and a period 602 in which a still image is displayed. FIG. 5 is a schematic diagram showing the frequency of writing an image signal per frame period, where "W" indicates a period in which an image signal is written, "H" indicates a period in which an image signal is held, and a period 603 indicates a unit frame period.

In the structure of the liquid crystal display device of this embodiment, an image signal of a still image displayed in the period 602 is written in a period 604, and the image signal written in the period 604 is held in the other period in the period 602.

Furthermore, a case in which the temperature of the liquid crystal display device illustrated in FIG. 1 fluctuates will be described below.

In a transistor used in the liquid crystal display device of this embodiment, electric characteristics fluctuate depending on the temperature. The fluctuation in electric characteristics of the transistor depending on the temperature will be described below.

The temperature of a substrate over which a transistor was formed was fixed at 40° C., 85° C., 150° C., and 200° C., and VG-ID characteristics of the transistor were obtained under two drain voltage conditions of 1 V and 10 V, at varying gate potential (also referred to as VG) from −10 V to 10 V. Note that "ID" refers to a current flowing between the source and the drain. Further, the measured transistor has a channel length L of 10 μm, a channel width of 200 μm, and a thickness of the gate insulating layer of 100 nm.

Figure 6A:
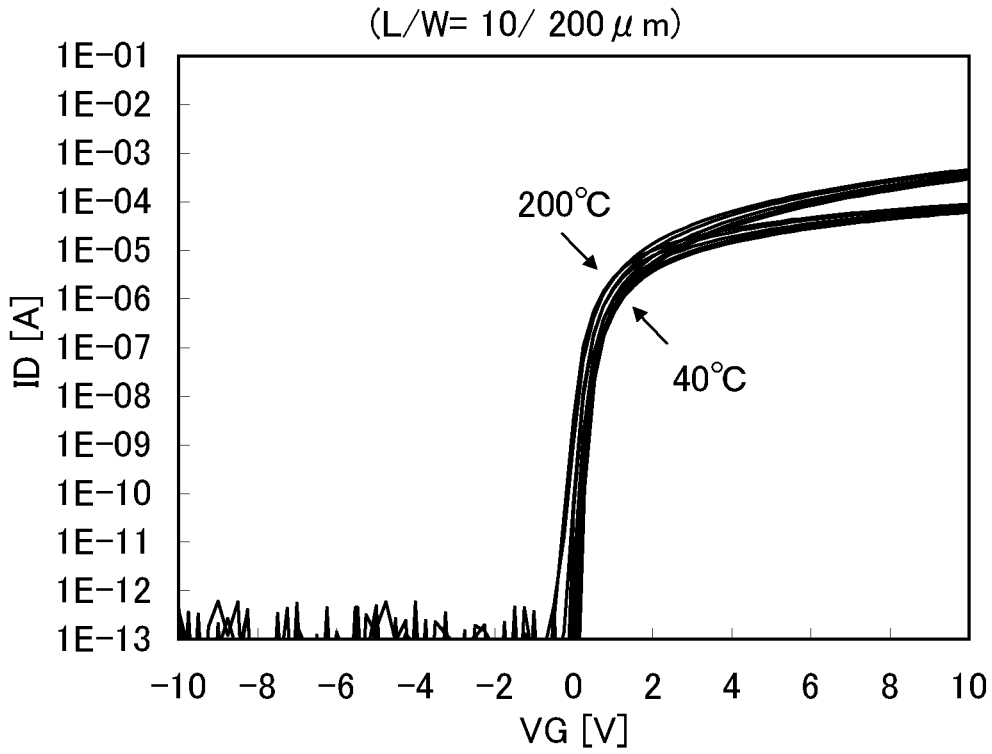
FIGS. 6A and 6B show a variation of electric characteristics of transistors depending on the temperature change.
Figure 6B:
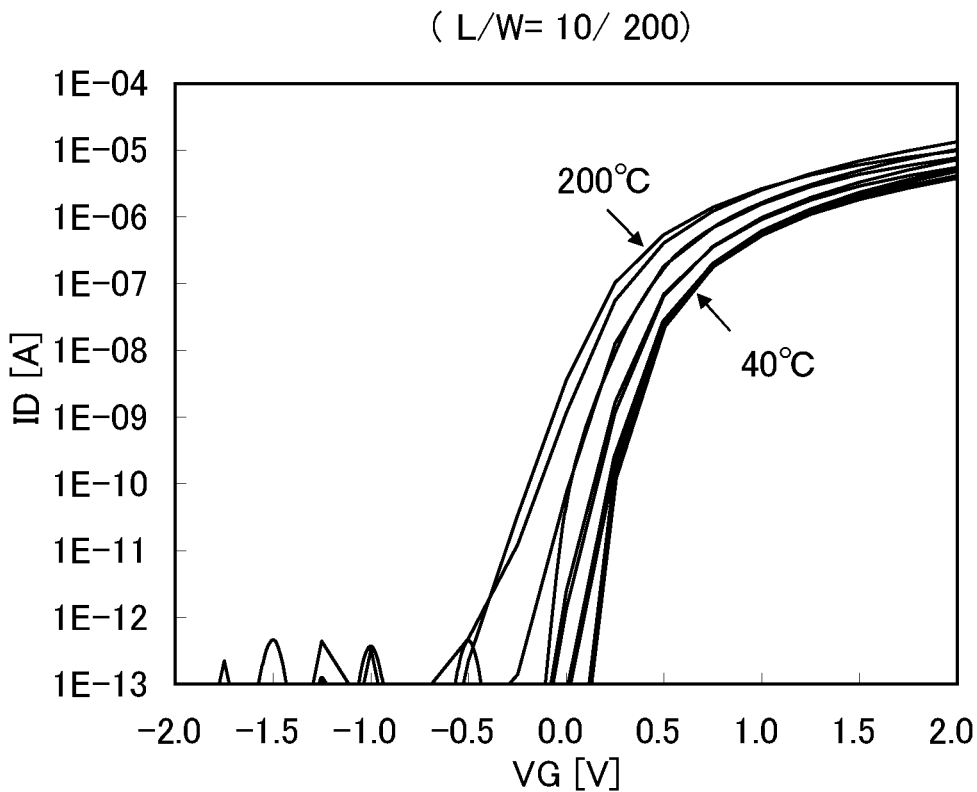

FIG. 6A shows VG-ID characteristics of the transistor measured at each of the above temperatures, and FIG. 6B is an enlarged view of the range of the gate potential from −2 V to 2 V in FIG. 6A. The rightmost curve indicated by an arrow in the diagram is a curve obtained at 40° C.; the leftmost curve is a curve obtained at 200° C.; and curves obtained at the other temperatures are located therebetween. As shown in FIGS. 6A and 6B, the cut-off current (a drain current when VG=0V) increases as the temperature increases; thus, a problem such as generation of a leakage current even when the transistor is in an off state arises.

Figure 7:
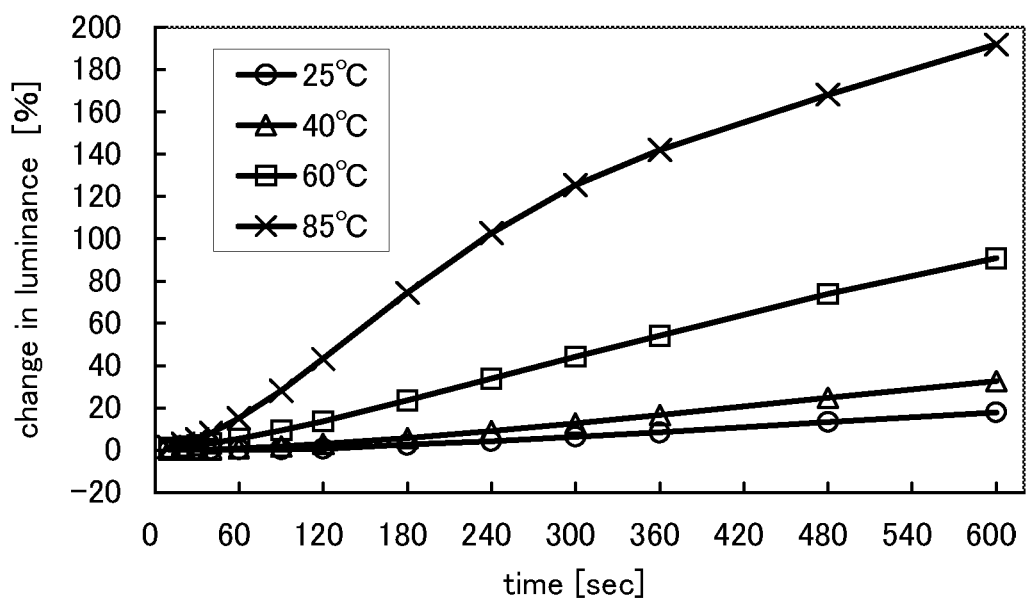
FIG. 7 shows a variation of holding voltage in a pixel of a display device depending on the temperature change.

FIG. 7 shows a voltage holding property after the writing of image data into a liquid crystal display device including the transistor. FIG. 7 shows the change over time in luminance of a pixel after the operation of a driver circuit is stopped after writing of the data of the image signal img into the pixel of the liquid crystal display device, where the horizontal axis indicates a holding period (e.g., the period 602 in FIG. 5) and the vertical axis indicates the percentage of the change in luminance of the pixel with respect to the reference value. In FIG. 7, as the luminance increases, the image is closer to white.

As shown in FIG. 7, it is found that when the temperature is higher or when the holding period is longer, the change in luminance of the pixel is increased. This is because the increase in temperature causes the leakage current of the transistor provided between the image signal line and the liquid crystal element to be larger and changes the potential of the pixel electrode of the liquid crystal element.

As a countermeasure against this, in the liquid crystal display device of this embodiment, the length of the period from the stop to the restart of the supply of a signal or voltage for operating the driver circuit portion 121 to the driver circuit portion 121 is set in accordance with the temperature of the liquid crystal display device. This can reduce adverse effects on display images even in the case where electric characteristics of the transistor fluctuate due to the temperature.

For example, as the temperature of the liquid crystal display device increases, the length of the period from the stop to the restart of the supply of the signal or voltage for operating the driver circuit portion 121 to the driver circuit portion 121 is shortened. This makes the writing interval of the data of the image signal img into the pixel 123 shorter. For example, in the result of FIG. 7, when the change in luminance is 20% or more, the change of the displayed image appears significantly. For example, at 60° C., it is preferable that the length of the period from the stop to the restart of the supply of the signal or voltage for operating the driver circuit portion 121 to the driver circuit portion 121 be set so that the holding time is 180 seconds. Further, at 85° C., it is preferable that the length of the period from the stop to the restart of the supply of the signal or voltage for operating the driver circuit portion 121 to the driver circuit portion 121 be set so that the holding time is 60 seconds. In this manner, adverse effects of the temperature change on the change in luminance of an image can be reduced.

The liquid crystal display device of this embodiment can reduce the frequency of writing an image signal. Accordingly, power consumption can be reduced.

In the case where a still image is displayed by rewriting the same image plural times, visible switching of the images may cause fatigue of the human eye. Since the frequency of writing an image signal is reduced in the liquid crystal display device of this embodiment, the level of eye fatigue caused can be made lower.

In particular, when a transistor having a small off-state current is used as a transistor in each pixel in the liquid crystal display device of this embodiment, the period of holding a voltage in a liquid crystal element or a storage capacitor can be lengthened. As a result, the frequency of writing an image signal can be reduced, so that power consumption can be reduced. In addition, the level of eye fatigue caused can be made lower.

(Embodiment 2)

In this embodiment, an example of a shift register which can be used in a scan line driver circuit and a signal line driver circuit of the display device described in the above embodiment will be described.

Figure 8A:
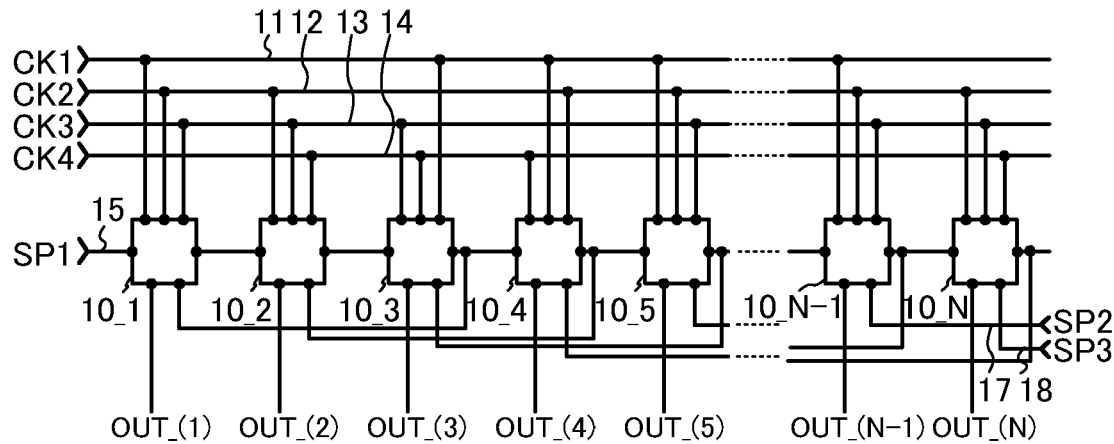
FIGS. 8A to 8C show an example of a configuration of a shift register in Embodiment 2.
Figure 8B:
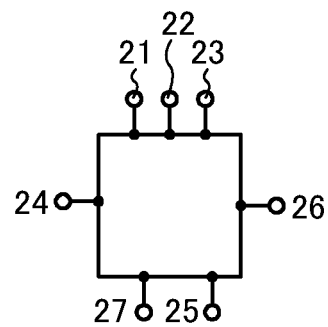
Figure 8C:
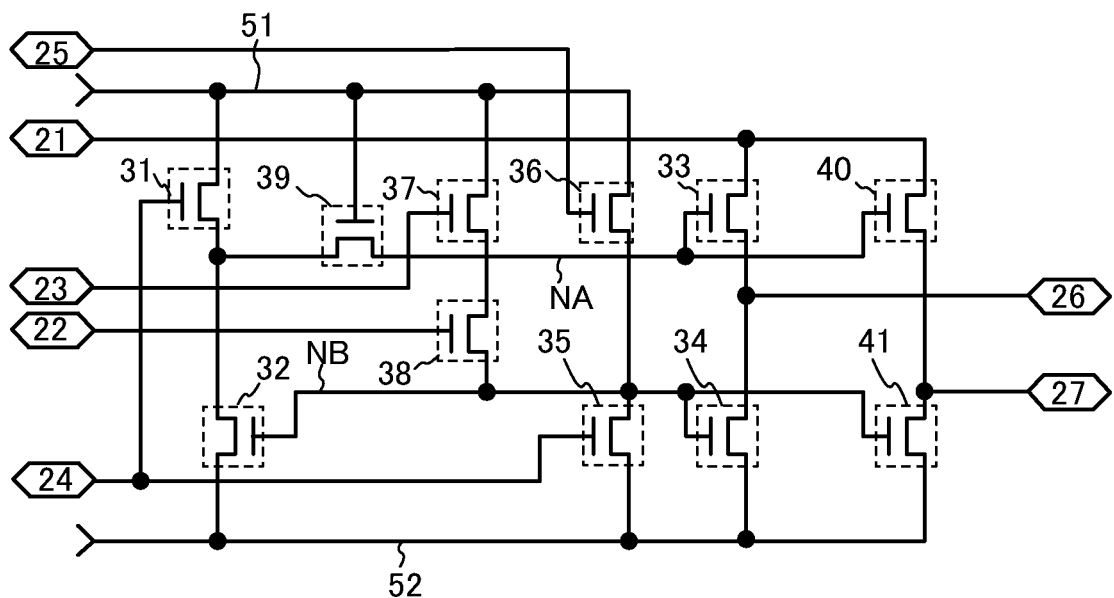

An example of the structure of the shift register in this embodiment will be described with reference to FIGS. 8A to 8C. FIGS. 8A to 8C are diagrams illustrating an example of the structure of the shift register of this embodiment.

The shift register illustrated in FIG. 8A includes a first to N-th pulse output circuits $10\_1$ to $10\_N$ (N is a natural number greater than or equal to 3).

Each of the first to N-th pulse output circuits $10\_1$ to $10\_N$ includes a first input terminal 21, a second input terminal 22, a third input terminal 23, a fourth input terminal 24, a fifth input terminal 25, a first output terminal 26, and a second output terminal 27 (see FIG. 8B). The first input terminal 21, the second input terminal 22, and the third input terminal 23 of each one of the pulse output circuits are electrically connected to different wirings from each other among first to fourth wirings 11 to 14, and each of the first input terminal 21, the second input terminal 22, and the third input terminal 23 is electrically connected to one of the first to fourth wirings 11 to 14.

In the first pulse output circuit $10\_1$ in FIGS. 8A and 8B, the first input terminal 21 is electrically connected to the first wiring 11, the second input terminal 22 is electrically connected to the second wiring 12, and the third input terminal 23 is electrically connected to the third wiring 13.

In the second pulse output circuit $10\_2$ in FIGS. 8A and 8B, the first input terminal 21 is electrically connected to the second wiring 12, the second input terminal 22 is electrically connected to the third wiring 13, and the third input terminal 23 is electrically connected to the fourth wiring 14.

In the shift register illustrated in FIG. 8A, a first clock signal CK1 is input through the first wiring 11, a second clock signal CK2 is input through the second wiring 12, a third clock signal CK3 is input through the third wiring 13, and a fourth clock signal CK4 is input through the fourth wiring 14.

Each of the first clock signal (CK1) to the fourth clock signal (CK4) is a digital signal whose level is repeatedly switched between high level and low level. The first to the fourth clock signals (CK1) to (CK4) are delayed by ¼ period sequentially. In the shift register of this embodiment, driving of the pulse output circuits is controlled with the first to fourth clock signals (CK1) to (CK4).

The fourth input terminal 24 of the first pulse output circuit $10\_1$ is electrically connected to a fifth wiring 15. A start signal SP1 (a first start pulse) is input through the fifth wiring 15 in the shift register of this embodiment.

Further, a previous stage signal OUT(n−1) is input from the pulse output circuit $10\_(n-1)$ of the previous stage to the n-th pulse output circuit 10_n (n is a natural number greater than or equal to 2 and less than or equal to N) in a second or subsequent stage.

Further, a signal from a third-pulse output circuit 10_3 in the stage that is two stages after the first pulse output circuit 10_1 is input to the first pulse output circuit 10_1; similarly, a later-stage signal OUT(l+2) (l is a natural number greater than or equal to 2 and less than or equal to N−2) is input from the (l+2)-th pulse output circuit 10_(l+2) in the stage that is two stages after the l-th pulse output circuit 10_l to the l-th pulse output circuit 10_l.

A pulse output circuit in each stage outputs a first output signal to a pulse output circuit in the previous stage and/or the subsequent stage and outputs a second output signal to a wiring or the like to which the pulse output circuit is electrically connected.

For example, in the first pulse output circuit 10_1 in FIGS. 8A and 8B, the start signal is input through the fourth input terminal 24, the later-stage signal (the second output signal from the third pulse output circuit 10_3) is input through the fifth input terminal 25, the first output signal is output through the first output terminal 26, and the second output signal is output through the second output terminal 27.

The later-stage signal OUT(l+2) is not input to the pulse output circuit 10_(N−1) in the (N−1)-th stage and the pulse output circuit 10_N in the N-th stage; therefore, like the shift register shown in FIG. 8A, a structure in which a second start signal SP2 is input to the pulse output circuit 10_(N−1) in the (N−1)-th stage through a sixth wiring 17 and a third start signal SP3 is input to the pulse output circuit 10_N in the N-th stage through a seventh wiring 18 may be employed. There is no limitation to the second start signal SP2 and the third start signal SP3, and a signal generated at the inside may be used instead of the second start signal SP2 and the third start signal SP3. For example, an (N+1)-th pulse output circuit 10_(N+1) and an (N+2)-th pulse output circuit 10_(N+2) (the circuits are also referred to as pulse output circuits in dummy stages) which do not contribute to pulse output to the pixel portion may be provided, so that a first output signal from the (N+1)-th pulse output circuit 10_(N+1) may be input to the fifth input terminal 25 of the (N−1)-th pulse output circuit 10_(N−1) and a first output signal from the (N+2)-th pulse output circuit 10_(N+2) may be input to the fifth input terminal 25 of the N-th pulse output circuit 10N. Alternatively, a structure in which another signal generated in the shift register is used may be employed.

Next, an example of a circuit configuration of the pulse output circuit in FIG. 8B will be described with reference to FIG. 8C. FIG. 8C is a circuit diagram showing an example of a circuit configuration of the pulse output circuit of FIG. 8B.

The pulse output circuit shown in FIG. 8C includes a transistor 31, a transistor 32, a transistor 33, a transistor 34, a transistor 35, a transistor 36, a transistor 37, a transistor 38, a transistor 39, a transistor 40, and a transistor 41.

One of a source and a drain of the transistor 31 is electrically connected to a power supply line 51, and a gate thereof is electrically connected to the fourth input terminal 24.

One of a source and a drain of the transistor 32 is electrically connected to a power supply line 52, and the other of the source and the drain of the transistor 32 is electrically connected to the other of the source and the drain of the transistor 31.

One of a source and a drain of the transistor 33 is electrically connected to the first input terminal 21, and the other of the source and the drain thereof is electrically connected to the first output terminal 26.

One of a source and a drain of the transistor 34 is electrically connected to the power supply line 52, the other of the source and the drain thereof is electrically connected to the first output terminal 26, and a gate thereof is electrically connected to a gate of the transistor 32.

One of a source and a drain of the transistor 35 is electrically connected to the power supply line 52, the other of the source and the drain thereof is electrically connected to the gate of the transistor 32, and a gate thereof is electrically connected to the fourth input terminal 24.

One of a source and a drain of the transistor 36 is electrically connected to the power supply line 51, the other of the source and the drain thereof is electrically connected to the gate of the transistor 32, and a gate thereof is electrically connected to the fifth input terminal 25.

One of a source and a drain of the transistor 37 is electrically connected to the power supply line 51, and a gate thereof is electrically connected to the third input terminal 23.

One of a source and a drain of the transistor 38 is electrically connected to the gate of the transistor 32, the other of the source and the drain thereof is electrically connected to the other of the source and the drain of the transistor 37, and a gate thereof is electrically connected to the second input terminal 22.

One of a source and a drain of the transistor 39 is electrically connected to the other of the source and the drain of the transistor 31 and the other of the source and the drain of the transistor 32, the other of the source and the drain thereof is electrically connected to a gate of the transistor 33, and a gate thereof is electrically connected to the power supply line 51.

One of a source and a drain of the transistor 40 is electrically connected to the first input terminal 21, the other of the source and the drain thereof is electrically connected to the second output terminal 27, and a gate thereof is electrically connected to the other of the source and the drain of the transistor 39.

One of a source and a drain of the transistor 41 is electrically connected to the power supply line 52, the other of the source and the drain thereof is electrically connected to the second output terminal 27, and a gate thereof is electrically connected to the gate of the transistor 32.

Note that in FIG. 8C, a portion where the gate of the transistor 33, the gate of the transistor 40, and the other of the source and the drain of the transistor 39 are connected to one another is referred to as a node NA. In addition, a portion where the gate of the transistor 32, the gate of the transistor 34, the other of the source and the drain of the transistor 35, the other of the source and the drain of the transistor 36, the other of the source and the drain of the transistor 38, and the gate of the transistor 41 are connected to one another is referred to as a node NB.

For example, in the first pulse output circuit 10_1, the first clock signal CK1 is input through the first input terminal 21, the second clock signal CK2 is input through the second input terminal 22, the third clock signal CK3 is input through the third input terminal 23, the start signal SP is input through the fourth input terminal 24, and a signal output from the first output terminal 26 of the third pulse output circuit 10_3 is input through the fifth input terminal 25. In addition, the first pulse output circuit 10_1 outputs a first output signal through the first output terminal 26, and outputs a signal OUT(1) that is a second output signal through the second output terminal 27.

Figure 9:
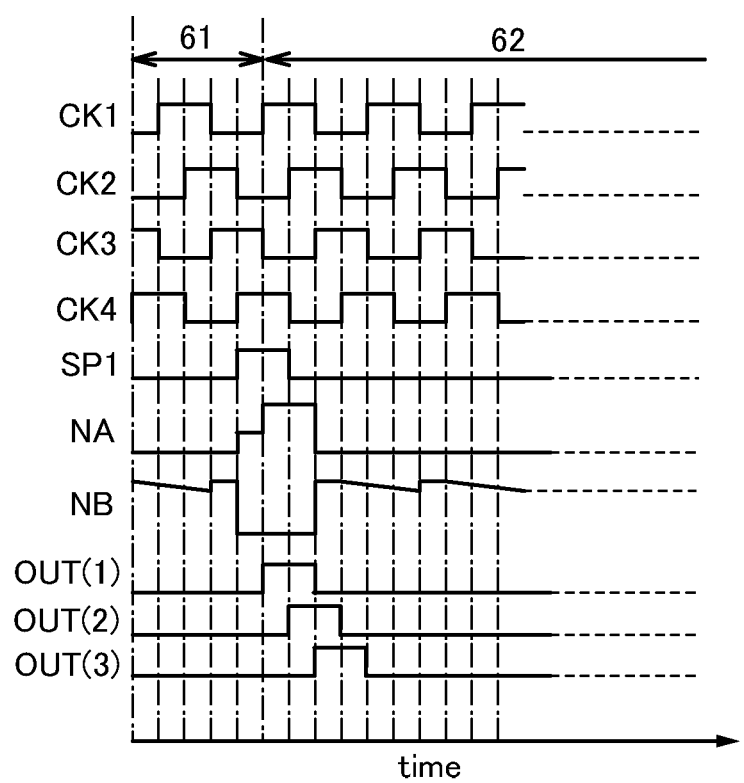
FIG. 9 shows an example of operation of the shift register in Embodiment 2.

Here, an example of the operation in the shift register of FIGS. 8A to 8C will be described with reference to FIG. 9. FIG. 9 is a timing chart showing an example of the operation of the shift register in FIGS. 8A to 8C. In the case of the shift register which is used in a scan line driver circuit, a period 61 in FIG. 9 is a vertical retrace period and a period 62 is a gate selection period.

With the above-described structure, a still image can be displayed without always operating the driver circuit portion.

This embodiment can be combined with or replaced by any of the other embodiments as appropriate.

(Embodiment 3)

In this embodiment, a transistor which can be used in the display device of the above embodiment will be described.

As the structure of the transistor which can be used in the display device of the above embodiment, a top-gate structure, a bottom-gate structure, and the like can be given, for example. Further, a staggered structure or a planar structure can be employed as the bottom-gate structure, for example.

The transistor described in the above embodiment may have a structure in which one channel formation region is formed (also referred to as a single-gate structure) or a structure in which a plurality of channel formation regions is formed (also referred to as a multi-gate structure). Alternatively, the transistor which can be used in the display device of the above embodiment may have a structure in which two gate electrode layers are provided over and below a channel formation region each with a gate insulating layer interposed therebetween (also referred to as a dual-gate structure) or the like.

Examples of the structure of the transistor of this embodiment will be described with reference to FIGS. 10A to 10D. FIGS. 10A to 10D are cross-sectional schematic views illustrating examples of the structure of the transistor of this embodiment.

Figure 10A:
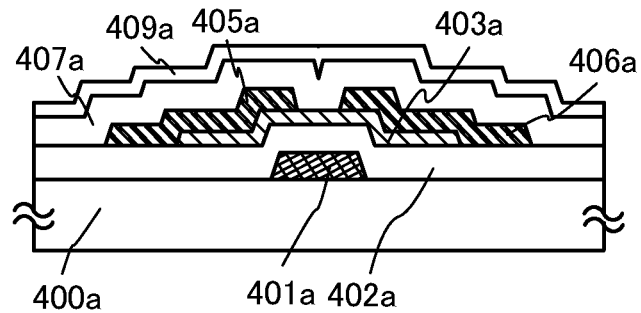
FIGS. 10A to 10D illustrate examples of the structure of a transistor in Embodiment 3.

A transistor illustrated in FIG. 10A is one type of a bottom-gate transistor and is also an inverted staggered transistor.

The transistor illustrated in FIG. 10A includes a gate electrode layer 401*a*, a gate insulating layer 402*a*, an oxide semiconductor layer 403*a*, a source electrode layer 405*a*, and a drain electrode layer 406*a*.

The gate electrode layer 401*a* is provided over a substrate 400*a*, the gate insulating layer 402*a* is provided over the gate electrode layer 401*a*, the oxide semiconductor layer 403*a* is provided over the gate electrode layer 401*a* with the gate insulating layer 402*a* interposed therebetween, and the source electrode layer 405*a* and the drain electrode layer 406*a* are each provided over the oxide semiconductor layer 403*a*.

In the transistor illustrated in FIG. 10A, an oxide insulating layer 407*a* is provided in contact with part of an upper surface of the oxide semiconductor layer 403*a* (part of the upper surface over which the source electrode layer 405*a* or the drain electrode layer 406*a* is not provided). In addition, a protective insulating layer 409*a* is provided over the oxide insulating layer 407*a*.

Figure 10B:
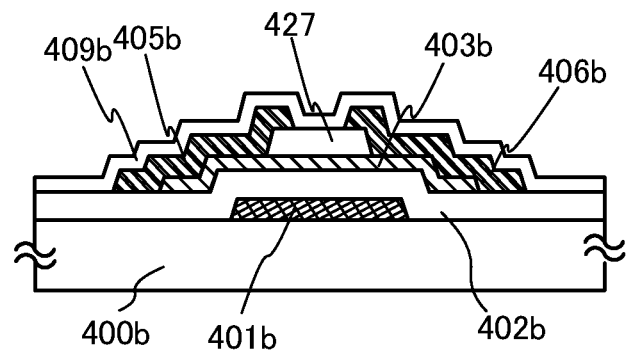

A transistor illustrated in FIG. 10B is one type of a bottom-gate transistor called a channel-protective (channel-stop) transistor and is also an inverted staggered transistor.

The transistor illustrated in FIG. 10B includes a gate electrode layer 401*b*, a gate insulating layer 402*b*, an oxide semiconductor layer 403*b*, an insulating layer 427, a source electrode layer 405*b*, and a drain electrode layer 406*b*.

The gate electrode layer 401*b* is provided over a substrate 400*b*, the gate insulating layer 402*b* is provided over the gate electrode layer 401*b*, the oxide semiconductor layer 403*b* is provided over the gate electrode layer 401*b* with the gate insulating layer 402*b* interposed therebetween, the insulating layer 427 is provided over the gate electrode layer 401*b* with the gate insulating layer 402*b* and the oxide semiconductor layer 403*b* interposed therebetween, and the source electrode layer 405*b* and the drain electrode layer 406*b* are provided over the oxide semiconductor layer 403*b* with the insulating layer 427 interposed therebetween.

Further, a protective insulating layer 409*b* is in contact with an upper portion of the transistor illustrated in FIG. 10B.

Figure 10C:
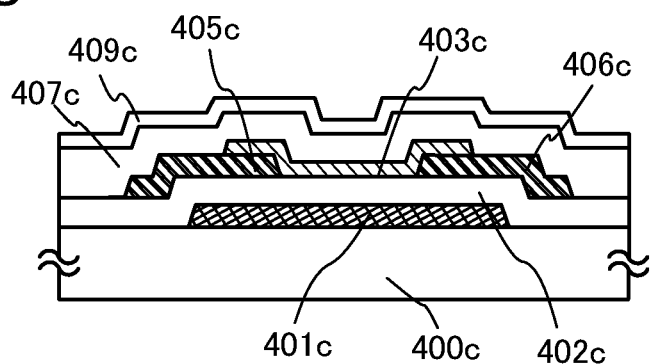

A transistor illustrated in FIG. 10C is one type of a bottom-gate transistor.

The transistor illustrated in FIG. 10C includes a gate electrode layer 401*c*, a gate insulating layer 402*c*, an oxide semiconductor layer 403*c*, a source electrode layer 405*c*, and a drain electrode layer 406*c*.

The gate electrode layer 401*c* is provided over a substrate 400*c*, the gate insulating layer 402*c* is provided over the gate electrode layer 401*c*, the source electrode layer 405*c* and the drain electrode layer 406*c* are provided over the gate insulating layer 402*c*, and the oxide semiconductor layer 403*c* is provided over the gate electrode layer 401*c* with the gate insulating layer 402*c*, the source electrode layer 405*c*, and the drain electrode layer 406*c* interposed therebetween.

Further in the transistor illustrated in FIG. 10C, an oxide insulating layer 407*c* is in contact with an upper surface and a side surface of the oxide semiconductor layer 403*c*. In addition, a protective insulating layer 409*c* is provided over the oxide insulating layer 407*c*.

Figure 10D:
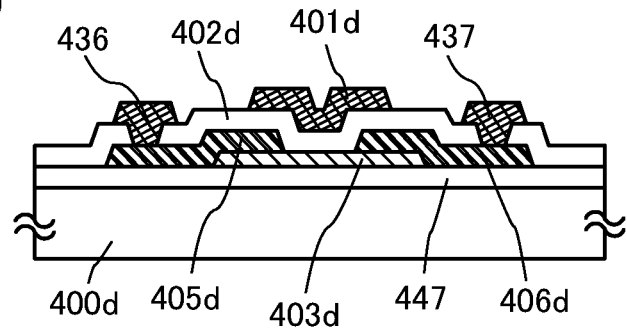

A transistor illustrated in FIG. 10D is one type of a top-gate transistor.

The transistor illustrated in FIG. 10D includes a gate electrode layer 401*d*, a gate insulating layer 402*d*, an oxide semiconductor layer 403*d*, a source electrode layer 405*d*, and a drain electrode layer 406*d*.

The oxide semiconductor layer 403*d* is provided over a substrate 400*d* with a base layer 447 interposed therebetween, the source electrode layer 405*d* and the drain electrode layer 406*d* are each provided over part of the oxide semiconductor layer 403*d*, the gate insulating layer 402*d* is provided over the oxide semiconductor layer 403*d*, the source electrode layer 405*d*, and the drain electrode layer 406*d*, and the gate electrode layer 401*d* is provided over the oxide semiconductor layer 403*d* with the gate insulating layer 402*d* interposed therebetween.

In the transistor illustrated in FIG. 10D, the source electrode layer 405*d* is in contact with a wiring layer 436 in an opening portion provided in the gate insulating layer 402*d*, and the drain electrode layer 406*d* is in contact with a wiring layer 437 in an opening portion provided in the gate insulating layer 402*d*.

As the substrates 400*a* to 400*d*, a glass substrate of barium borosilicate glass, aluminoborosilicate glass, or the like can be used, for example.

Alternatively, a substrate formed of an insulator, such as a ceramic substrate, a quartz substrate, or a sapphire substrate can be used as the substrates 400*a* to 400*d*. Further alternatively, crystallized glass can be used as the substrates 400*a* to 400*d*. Still further alternatively, a plastic substrate or the like or a semiconductor substrate of silicon or the like can be used as the substrates 400*a* to 400*d*.

The base layer 447 has a function of preventing diffusion of an impurity element from the substrate 400*d*. As the base layer 447, a silicon nitride layer, a silicon oxide layer, a silicon nitride oxide layer, a silicon oxynitride layer, an aluminum oxide layer, or an aluminum oxynitride layer can be used, for example. The base layer 447 can also be formed by stacking layers of materials which can be applied to the base layer 447.

Also in the transistors illustrated in FIGS. 10A to 10C, a base layer may be provided between the substrate and the gate electrode layer as in the transistor illustrated in FIG. 10D.

As the gate electrode layers 401a to 401d, a layer of a metal material such as molybdenum, titanium, chromium, tantalum, tungsten, aluminum, copper, neodymium, or scandium or an alloy material containing any of these materials as a main component can be used, for example. The gate electrode layers 401a to 401d can also be formed by stacking layers of materials which can be applied to the gate electrode layers 401a to 401d.

As the gate insulating layers 402a to 402d, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The gate insulating layers 402a to 402d can also be formed by stacking layers of materials which can be applied to the gate insulating layers 402a to 402d. The layers of materials which can be applied to the gate insulating layers 402a to 402d can be formed by a plasma CVD method, a sputtering method, or the like, for example. For example, the gate insulating layers 402a to 402d can be formed in such a manner that a silicon nitride layer is formed by a plasma CVD method and a silicon oxide layer is formed over the silicon nitride layer by a plasma CVD method.

As an oxide semiconductor which can be used in the oxide semiconductor layers 403a to 403d, an four-component metal oxide, a three-component metal oxide, and a two-component metal oxide can be given, for example. As the four-component metal oxide, an In—Sn—Ga—Zn—O-based metal oxide and the like can be given, for example. As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, and the like can be given, for example. As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, and the like can be given. Further, as the oxide semiconductor, an In—O-based metal oxide, a Sn—O-based metal oxide, a Zn—O-based metal oxide, or the like can be used. The metal oxide that can be used as the oxide semiconductor may contain $SiO_2$. Here, for example, the In—Ga—Zn—O-based metal oxide means an oxide containing at least In, Ga, and Zn, and the composition ratio of the elements is not particularly limited. The In—Ga—Zn—O-based metal oxide may contain an element other than the In, Ga, and Zn.

Further, as an oxide semiconductor which can be used in the oxide semiconductor layers 403a to 403d, a metal oxide represented by a chemical formula $InMO_3(ZnO)_m$ (m is larger than 0) can be given. Here, M represents one or more metal elements selected from Ga, Al, Mn, and Co. For example, Ga, Ga and Al, Ga and Mn, Ga and Co, and the like can be given as M.

As the source electrode layers 405a to 405d and the drain electrode layers 406a to 406d, a layer of a metal material such as aluminum, chromium, copper, tantalum, titanium, molybdenum, or tungsten or an alloy material containing any of the metal materials as a main component can be used, for example. The source electrode layers 405a to 405d and the drain electrode layers 406a to 406d can also be formed by stacking layers of materials which can be applied to the source electrode layers 405a to 405d and the drain electrode layers 406a to 406d.

For example, the source electrode layers 405a to 405d and the drain electrode layers 406a to 406d can be formed by stacking a metal layer of aluminum or copper and a high-melting-point metal layer of titanium, molybdenum, tungsten, or the like. The source electrode layers 405a to 405d and the drain electrode layers 406a to 406d may have a structure in which a metal layer of aluminum or copper is provided between a plurality of high-melting-point metal layers. Further, when the source electrode layers 405a to 405d and the drain electrode layers 406a to 406d are formed using an aluminum layer to which an element that prevents generation of hillocks or whiskers (e.g., Si, Nd, or Si) is added, heat resistance can be increased.

Alternatively, the source electrode layers 405a to 405d and the drain electrode layers 406a to 406d can be formed using a layer containing a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated as ITO), an alloy of indium oxide and zinc oxide ($In_2O_3$—ZnO), or such a metal oxide material containing silicon oxide can be used, for example.

Furthermore, another wiring may be formed using the material used to form the source electrode layers 405a to 405d and the drain electrode layers 406a to 406d.

As the wiring layer 436 and the wiring layer 437, a layer of a material which can be applied to the source electrode layers 405a to 405d and the drain electrode layers 406a to 406d can be used. The wiring layer 436 and the wiring layer 437 can also be formed by stacking layers of materials which can be applied to the wiring layer 436 and the wiring layer 437.

As the insulating layer 427, a layer which can be applied to the base layer 447 can be used, for example. The insulating layer 427 can also be formed by stacking layers of materials which can be applied to the insulating layer 427.

As the oxide insulating layer 407a and the oxide insulating layer 407c, an oxide insulating layer can be used and, for example, a silicon oxide layer or the like can be used. The oxide insulating layer 407a and the oxide insulating layer 407c can also be formed by stacking layers of materials which can be applied to the oxide insulating layer 407a and the oxide insulating layer 407c.

As the protective insulating layers 409a to 409c, an inorganic insulating layer can be used and, for example, a silicon nitride layer, an aluminum nitride layer, a silicon nitride oxide layer, an aluminum nitride oxide layer, or the like can be used. The protective insulating layers 409a to 409c can also be formed by stacking layers of materials which can be applied to the protective insulating layers 409a to 409c.

In the display device of the above embodiment, in order to reduce surface unevenness due to the transistor of this embodiment, a planarization insulating layer can be provided over the transistor (in the case where the transistor includes an oxide insulating layer or a protective insulating layer, over the transistor with the oxide insulating layer or the protective insulating layer interposed therebetween). As the planarization insulating layer, a layer of an organic material such as polyimide, acrylic, or benzocyclobutene can be used. Alternatively, a layer of a low-dielectric constant material (a low-k material) can be used as the planarization insulating layer. The planarization insulating layer can also be formed by stacking layers of materials which can be applied to the planarization insulating layer.

Next, as an example of a manufacturing method of the transistor of this embodiment, an example of a manufacturing method of the transistor illustrated in FIG. 10A will be described with reference to FIGS. 11A to 11E. FIGS. 11A to 11E illustrate an example of the manufacturing method of the transistor illustrated in FIG. 10A. Note that an example of the manufacturing method of the transistor illustrated in FIG.

10A will be described as an example in this embodiment, the manufacturing method of the transistor of this embodiment is not limited thereto. For example, as for the components of FIGS. 10B to 10D whose designations are the same as those of the components of FIG. 10A except for the reference numerals, description of the example of the manufacturing method of the transistor illustrated in FIG. 10A can be referred to as appropriate.

First, the substrate 400a is prepared, and a first conductive film is formed over the substrate 400a.

A glass substrate is used as the substrate 400a as an example.

As the first conductive film, a film of a metal material such as molybdenum, titanium, chromium, tantalum, tungsten, aluminum, copper, neodymium, or scandium, or an alloy material which contains any of the metal materials as a main component can be used. The first conductive film can also be formed by stacking layers of materials which can be applied to the first conductive film.

Next, a first photolithography process is carried out: a first resist mask is formed over the first conductive film, the first conductive film is selectively etched with the use of the first resist mask to form the gate electrode layer 401a, and the first resist mask is removed.

In this embodiment, the resist mask may be formed by an ink-jet method. Formation of the resist mask by an inkjet method needs no photomask; thus, manufacturing cost can be reduced.

In order to reduce the number of photomasks and steps in the photolithography process, the etching step may be performed using a resist mask formed by a multi-tone mask. A multi-tone mask is a mask through which light is transmitted to have a plurality of intensities. A resist mask formed with the use of the multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed with one multi-tone mask. Thus, the number of light-exposure masks can be reduced and the number of corresponding photolithography processes can also be reduced, whereby a manufacturing process can be simplified.

Next, the gate insulating layer 402a is formed over the gate electrode layer 401a.

As the oxide semiconductor used in the transistor of this embodiment, an oxide semiconductor which is made to be an i-type or substantially i-type semiconductor by removing an impurity is used. Such a purified oxide semiconductor is highly sensitive to an interface state and interface charge; thus, an interface between the oxide semiconductor layer and the gate insulating layer is important. For this reason, the gate insulating layer that is in contact with a purified oxide semiconductor needs to have high quality. Therefore, the gate insulating layer 402a is preferably an insulating layer which has a low interface state density with the oxide semiconductor and can form a favorable interface as well as having a favorable film quality.

For example, the gate insulating layer 402a can be formed by a high-density plasma CVD method. For example, a high-density plasma CVD method using microwaves (e.g., microwaves with a frequency of 2.45 GHz) is preferable because an insulating layer can be dense and have high withstand voltage and high quality. This is because when the purified oxide semiconductor layer is closely in contact with the high-quality gate insulating layer, the interface state can be reduced and interface characteristics can be favorable.

Another film formation method such as a sputtering method or a plasma CVD method can also be employed to form the gate insulating layer 402a. Further, heat treatment may be performed after formation of the gate insulating layer 402a. The heat treatment can improve film quality of the gate insulating layer 402a and interface characteristics between the gate insulating layer 402a and the oxide semiconductor.

Figure 11A:
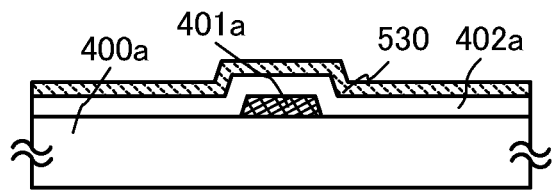
FIGS. 11A to 11E illustrate an example of a manufacturing method of a transistor in Embodiment 3.
Figure 11B:
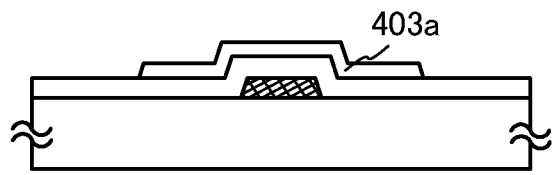

Next, over the gate insulating layer 402a, an oxide semiconductor film 530 having a thickness greater than or equal to 2 nm and less than or equal to 200 nm, preferably greater than or equal to 5 nm and less than or equal to 30 nm is formed (see FIG. 11A). For example, the oxide semiconductor film 530 can be formed by a sputtering method.

Note that before formation of the oxide semiconductor film 530, powdery substances (also referred to as particles or dust) attached on a surface of the gate insulating layer 402a are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere so that plasma is generated to modify a surface of the substrate. Note that instead of argon, nitrogen, helium, oxygen, or the like may be used.

For example, the oxide semiconductor film 530 can be formed using an oxide semiconductor material which can be used as a material of the oxide semiconductor layer 403a. In this embodiment, the oxide semiconductor film 530 is formed by a sputtering method with the use of an In—Ga—Zn—O-based oxide target. Further, the oxide semiconductor film 530 can be formed by a sputtering method in a rare gas (typically, argon) atmosphere, an oxygen atmosphere, or a mixed atmosphere of a rare gas and oxygen.

As a target for forming the oxide semiconductor film 530 by a sputtering method, for example, an oxide target having a composition ratio of $In_2O_3:Ga_2O_3:ZnO=1:1:1$ [molar ratio] can be used, for example. Without limitation to the above target, an oxide target having a composition ratio of $In_2O_3:Ga_2O_3:ZnO=1:1:2$ [molar ratio] may be used, for example. The proportion of the volume of a portion except for an area occupied by a space and the like with respect to the total volume of the oxide target (also referred to as the filling percentage) is higher than or equal to 90% and lower than or equal to 100%, and preferably higher than or equal to 95% and lower than or equal to 99.9%. The oxide semiconductor film formed with the use of a metal oxide target having a high filling percentage has high density.

For example, a high-purity gas from which an impurity such as hydrogen, water, hydroxyl, or hydride is removed is preferably used as a sputtering gas used in formation of the oxide semiconductor film 530.

Before formation of the oxide semiconductor film 530, it is preferable that the substrate 400a over which the gate electrode layer 401a is formed or the substrate 400a over which the gate electrode layer 401a and the gate insulating layer 402a are formed be preheated in a preheating chamber of the sputtering apparatus, so that an impurity such as hydrogen or moisture adsorbed on the substrate 400a is eliminated and removed. The preheating can prevent hydrogen, hydroxyl, and moisture from entering the gate insulating layer 402a and the oxide semiconductor film 530. Note that a cryopump is preferable as an exhaustion unit provided in the preheating chamber. The preheating treatment may be omitted. Further, the preheating may be similarly performed before formation of the oxide insulating layer 407a, on the substrate 400a over which layers up to the source electrode layer 405a and the drain electrode layer 406a have been formed.

When the oxide semiconductor film 530 is formed by a sputtering method, the substrate 400a is held inside a film formation chamber which is kept in a reduced pressure state, and the substrate temperature is set to be higher than or equal to 100° C. and lower than or equal to 600° C., preferably higher than or equal to 200° C. and lower than or equal to 400° C. By heating the substrate 400a, the concentration of an impurity contained in the oxide semiconductor film 530 can be reduced. Further, heating of the substrate 400a can reduce damage due to the sputtering method. In addition, a sputtering gas from which hydrogen and moisture are removed is introduced while remaining moisture in the film formation chamber is removed, and the above-described target is used; thus, the oxide semiconductor film 530 is formed over the substrate 400a.

In order to remove remaining water in the film formation chamber, an entrapment vacuum pump such as a cryopump, an ion pump, or a titanium sublimation pump is preferably used. Further, an exhaustion unit may be a turbo pump provided with a cold trap. In the case where the film formation chamber is exhausted with a cryopump, a hydrogen atom, a compound containing a hydrogen atom such as water, further preferably, a compound containing a hydrogen atom and a carbon atom, or the like is removed. Accordingly, with a cryopump, the concentration of an impurity contained in the oxide semiconductor film 530 that is formed in the film formation chamber can be reduced.

As one example of the film formation condition, the following can be employed: the distance between the substrate 400a and the target is 100 mm, the pressure is 0.6 Pa, the direct-current (DC) power is 0.5 kW, and the atmosphere is an oxygen atmosphere (the proportion of the oxygen flow is 100%). Note that a sputtering method using a pulse direct-current power supply is preferable because powdery substances generated at the time of film formation can be reduced and the film thickness can be made uniform.

Next, a second photolithography process is carried out: a second resist mask is formed over the oxide semiconductor film 530, the oxide semiconductor film 530 is selectively etched with the use of the second resist mask to process the oxide semiconductor film 530 into an island-shaped oxide semiconductor layer, and the second resist mask is removed.

In the case of forming a contact hole in the gate insulating layer 402a, the contact hole can be formed at the time of processing the oxide semiconductor film 530 into the island-shaped oxide semiconductor layer.

For example, dry etching, wet etching, or both dry etching and wet etching can be employed for etching the oxide semiconductor film 530. As an etchant used for wet etching of the oxide semiconductor film 530, a mixed solution of phosphoric acid, acetic acid, and nitric acid, or the like can be used, for example. Further, ITO07N (produced by KANTO CHEMICAL CO., INC.) may also be used.

Next, the oxide semiconductor layer is subjected to first heat treatment. Through the first heat treatment, the oxide semiconductor layer can be dehydrated or dehydrogenated. The temperature of the first heat treatment is higher than or equal to 350° C. and lower than or equal to 750° C., preferably higher than or equal to 350° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then the oxide semiconductor layer is not exposed to the air so that entry of water and hydrogen into the oxide semiconductor layer is prevented. In this manner, the oxide semiconductor layer 403a is obtained (see FIG. 11B).

The heat treatment apparatus is not limited to the electric furnace and may be the one provided with a device for heating a process object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high temperature gas, an inert gas which does not react with a process object by heat treatment, such as nitrogen or a rare gas like argon, is used.

For example, as the first heat treatment, GRTA may be performed in the following manner. The substrate is transferred and put in an inert gas which has been heated to a high temperature of 650° C. to 700° C., heated for several minutes, and transferred and taken out of the inert gas which has been heated to a high temperature.

Note that in the first heat treatment, it is preferable that water, hydrogen, and the like be not contained in nitrogen or a rare gas such as helium, neon, or argon. It is preferable that nitrogen or a rare gas such as helium, neon, or argon introduced into the heat treatment apparatus have a purity of 6N (99.9999%) or more, preferably, 7N (99.99999%) or more (that is, the impurity concentration is set to 1 ppm or lower, preferably, 0.1 ppm or lower).

After the oxide semiconductor layer is heated by the first heat treatment, a high-purity oxygen gas, a high-purity $N_2O$ gas, or ultra-dry air (having a dew point of −40° C. or lower, preferably −60° C. or lower) may be introduced into the same furnace. It is preferable that the oxygen gas or the $N_2O$ gas do not contain water, hydrogen, and the like. The purity of the oxygen gas or the $N_2O$ gas which is introduced into the heat treatment apparatus is preferably 6N or more, further preferably 7N or more (i.e., the impurity concentration of the oxygen gas or the $N_2O$ gas is preferably 1 ppm or lower, further preferably 0.1 ppm or lower). By the effect of the oxygen gas or the $N_2O$ gas, oxygen, which is a main component of the oxide semiconductor but has been reduced through the step of eliminating an impurity by the dehydration or dehydrogenation treatment, is supplied; thus, the oxide semiconductor layer 403a is purified.

The first heat treatment may also be performed on the oxide semiconductor film 530 before being processed into the island-shaped oxide semiconductor layer. In such a case, the substrate is taken out of the heating apparatus after the first heat treatment and then the oxide semiconductor film 530 is processed into the island-shaped oxide semiconductor layer.

Other than the above-described timings, the first heat treatment may be performed after the formation of the oxide semiconductor layer, for example, after formation of the source electrode layer 405a and the drain electrode layer 406a over the oxide semiconductor layer 403a or after formation of the oxide insulating layer 407a over the source electrode layer 405a and the drain electrode layer 406a.

In the case of forming a contact hole in the gate insulating layer 402a, the contact hole may be formed before the first heat treatment is performed on the oxide semiconductor film 530.

The oxide semiconductor layer may be formed using an oxide semiconductor film which is formed through two deposition steps so as to be a thick film including a crystalline region (a single crystal region), that is, a crystalline region having c-axes aligned in a direction perpendicular to a surface of the film, regardless of the material of a base component such as an oxide, a nitride, a metal, or the like. For example, a first oxide semiconductor film with a thickness greater than or equal to 3 nm and less than or equal to 15 nm is deposited and subjected to first heat treatment at a temperature higher than or equal to 450° C. and lower than or equal to 850° C., preferably higher than or equal to 550° C. and lower than or equal to 750° C. under an atmosphere of nitrogen, oxygen, a rare gas, or dry air, so that the first oxide semiconductor film which includes a crystalline region (including a plate-like crystal) in a region including a surface is formed. Then, a second oxide semiconductor film that is thicker than the first oxide semiconductor film is formed and subjected to heat treatment at a temperature higher than or equal to 450° C. and lower than or equal to 850° C., preferably higher than or equal to 600° C. and lower than or equal to 700° C., so that crystal growth proceeds toward the upper side using the first oxide semiconductor film as a seed of the crystal growth and the entire region of the second oxide semiconductor film is crystallized. Using the film including a crystalline region, which is thick as a consequence, an oxide semiconductor layer may be formed.

Next, a second conductive film is formed over the gate insulating layer 402a and the oxide semiconductor layer 403a.

As the second conductive film, a film of a metal material such as aluminum, chromium, copper, tantalum, titanium, molybdenum, or tungsten, or an alloy material which contains any of the metal materials as a main component can be used, for example. The second conductive film can also be formed by stacking films of materials which can be applied to the second conductive film.

Figure 11C:
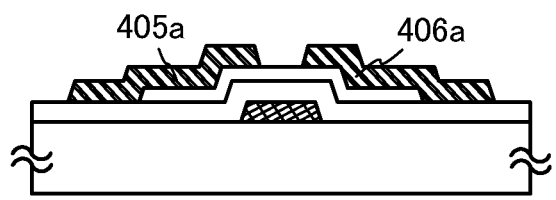

Next, a third photolithography process is carried out: a third resist mask is formed over the second conductive film, the second conductive film is selectively etched with the use of the third resist mask to form the source electrode layer 405a and the drain electrode layer 406a, and the third resist mask is removed (see FIG. 11C).

Furthermore, another wiring may be formed from the second conductive film at the time of forming the source electrode layer 405a and the drain electrode layer 406a.

In light exposure in forming the third resist mask, ultraviolet light, KrF laser light, or ArF laser light is preferably used. A channel length L of the transistor to be completed later depends on the width of an interval between a bottom end of the source electrode layer 405a and a bottom end of the drain electrode layer 406a which are adjacent to each other over the oxide semiconductor layer 403a. In the case where the channel length L is less than 25 nm, the light exposure at the time of forming the third resist mask is preferably performed using extreme ultraviolet light having an extremely short wavelength of several nanometers to several tens of nanometers. In light exposure using extreme ultraviolet light, resolution is high and depth of focus is large. Therefore, the channel length L of the transistor to be completed later can be greater than or equal to 10 nm and less than or equal to 1000 nm, and usage of such a transistor formed through the light exposure as described above enables higher speed operation of a circuit. In addition, since the value of the off-state current of the transistor is extremely small, power consumption of a circuit including the transistor can be reduced.

In the case of etching the second conductive film, etching conditions are preferably optimized in order to prevent the oxide semiconductor layer 403a from being divided by the etching. However, it is difficult to set conditions under which only the second conductive film can be etched and the oxide semiconductor layer 403a is not etched. In some cases, part of the oxide semiconductor layer 403a is etched at the time of etching the second conductive film, so that the oxide semiconductor layer 403a comes to include a groove portion (depression portion).

In this embodiment, a titanium film is used as an example of the second conductive film, an In—Ga—Zn—O-based oxide semiconductor is used as an example of the oxide semiconductor layer 403a, and an ammonia hydrogen peroxide solution (a mixture of ammonia, water, and a hydrogen peroxide solution) is used as an etchant.

Next, the oxide insulating layer 407a is formed over the oxide semiconductor layer 403a, the source electrode layer 405a, and the drain electrode layer 406a. Here, the oxide insulating layer 407a is in contact with part of the upper surface of the oxide semiconductor layer 403a.

The oxide insulating layer 407a can be formed to a thickness of at least 1 nm or more using a method by which impurities such as water and hydrogen are not introduced into the oxide insulating layer 407a, such as a sputtering method, as appropriate. When hydrogen is contained in the oxide insulating layer 407a, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. Therefore, it is important that a formation method in which hydrogen is not used is employed in order to form the oxide insulating layer 516 containing as little hydrogen as possible.

In this embodiment, a silicon oxide film having a thickness of 200 nm is formed by a sputtering method as the oxide insulating layer 407a. The substrate temperature at the time of the film formation may be higher than or equal to room temperature and lower than or equal to 300° C.; in this embodiment, the substrate temperature is 100° C. as an example. The formation of a silicon oxide film by a sputtering method can be performed in a rare gas (typically, argon) atmosphere, an oxygen atmosphere, or an mixed atmosphere of a rare gas and oxygen.

Further, a silicon oxide target or a silicon target can be used as a target for forming the oxide insulating layer 407a. For example, with use of a silicon target, a silicon oxide film can be formed by a sputtering method under an atmosphere containing oxygen.

In order to remove remaining water in a film formation chamber that is used for forming the oxide insulating layer 407a, an entrapment vacuum pump such as a cryopump is preferably used. By removing remaining water in a film formation chamber with a cryopump, the concentration of an impurity contained in the oxide insulating layer 407a can be reduced. As an exhaustion unit for removing remaining water in the film formation chamber that is used for forming the oxide insulating layer 407a, a turbo pump provided with a cold trap can be used.

Further, a high-purity gas from which an impurity such as hydrogen, water, hydroxyl, or hydride is removed is preferably used as a sputtering gas used in formation of the oxide semiconductor layer 407a.

Before formation of the oxide insulating layer 407a, plasma treatment with the use of a gas such as $N_2O$, $N_2$, or Ar may be performed to remove water or the like adsorbed on an exposed surface of the oxide semiconductor layer 403a. In the case where plasma treatment is performed, the oxide insulating layer 407a which is in contact with part of the upper surface of the oxide semiconductor layer 403a is preferably formed without exposure to the air.

Then, second heat treatment (preferably, at a temperature higher than or equal to 200° C. and lower than or equal to 400° C., for example, higher than or equal to 250° C. and lower than or equal to 350° C.) can be performed in an inert gas atmosphere or in an oxygen gas atmosphere. For example, the second heat treatment is performed at 250° C. in a nitrogen atmosphere for one hour. By the second heat treatment, heat is applied while part of the upper surface of the oxide semiconductor layer 403a is in contact with the oxide insulating layer 407a.

Through the above-described process, the first heat treatment is performed on the oxide semiconductor film, so that an impurity such as hydrogen, moisture, hydroxyl group, or hydride (also referred to as a hydrogen compound) can be intentionally removed from the oxide semiconductor layer, and in addition, oxygen, which is a main component of the oxide semiconductor but has been reduced through the step of eliminating an impurity can be supplied. Therefore, the oxide semiconductor layer is purified and is made to be an i-type (intrinsic) semiconductor.

Figure 11D:
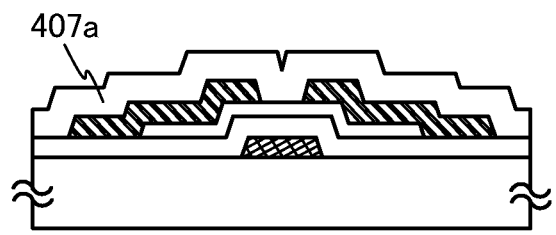
Figure 11E:
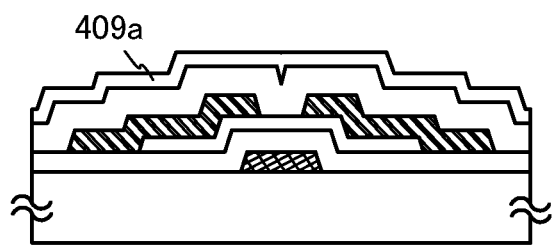

Through the above-described process, the transistor is formed (see FIG. 11D).

When a silicon oxide layer having many defects is used as the oxide insulating layer, the heat treatment after formation of the silicon oxide layer has an effect of diffusing an impurity such as hydrogen, moisture, hydroxyl group, or hydride contained in the oxide semiconductor layer to the oxide insulating layer so that the impurity contained in the oxide semiconductor layer can be further reduced.

The protective insulating layer 409a may be further formed over the oxide insulating layer 407a. For example, a silicon nitride film is formed by an RF sputtering method. The RF sputtering method is preferable as a formation method of a protective insulating layer because it achieves high mass productivity. As the protective insulating layer, an inorganic insulating film which does not include an impurity such as moisture and prevents entry of such impurity from the outside, such as a silicon nitride film or an aluminum nitride film can be used. In this embodiment, as the protective insulating layer 409a, a silicon nitride film is formed (see FIG. 11E).

In this embodiment, the protective insulating layer 409a is formed in such a manner that the substrate 400a over which layers up to the oxide insulating layer 407a are formed is heated at a temperature of 100° C. to 400° C. and a silicon nitride film is formed with the use of a target of a silicon semiconductor and a sputtering gas containing high-purity nitrogen from which hydrogen and moisture are removed. In this case also, the protective insulating layer 409a is preferably formed while removing remaining moisture in a treatment chamber, similarly to the oxide insulating layer 407a.

After formation of the protective insulating layer 409a, heat treatment may be further performed at a temperature higher than or equal to 100° C. and lower than or equal to 200° C. under the air for more than or equal to 1 hour and less than or equal to 30 hours. The heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature.

As described above, the transistor of this embodiment is a transistor including an oxide semiconductor layer as a channel formation layer. The oxide semiconductor layer used in the transistor of this embodiment is purified by heat treatment and thereby becomes an i-type or substantially i-type oxide semiconductor layer.

The purified oxide semiconductor layer includes extremely few carriers (close to 0). The carrier concentration of the oxide semiconductor layer is less than $1\times10^{14}/cm^3$, preferably less than $1\times10^{12}/cm^3$, and further preferably less than $1\times10^{11}/cm^3$. Since the number of carriers in the oxide semiconductor layer is extremely small, the off-state current of the transistor of this embodiment can be reduced. It is preferable that off-state current be as small as possible. In the transistor of this embodiment, the off-state current density per a channel width of 1 μm can be 10 aA/μm ($1\times10^{-17}$ A/μm) or less, preferably 1 aA/μm ($1\times10^{-18}$ A/μm) or less, further preferably 10 zA/μm ($1\times10^{-20}$ A/μm) or less, and still further preferably 1 zA/μm ($1\times10^{-21}$ A/μm) or less.

When a transistor having a small off-state current is used as a pixel transistor in the liquid crystal display device of Embodiment 1, for example, the number of rewriting operations (also referred to as refresh) of image data at the time of displaying a still image can be reduced.

The transistor of this embodiment has a relatively high field-effect mobility and is capable of high-speed driving. Therefore, when the transistor of this embodiment is used in the display device of Embodiment 1 for example, the image quality can be improved. By using the transistor of this embodiment in the display device of Embodiment 1, the driver circuit portion and the pixel portion can be manufactured over the same substrate. Accordingly, the number of components of the display device can be reduced, and even in the case of bending the display device for example, generation of connection defects between the driver circuit portion and the pixel portion can be prevented.

This embodiment can be combined with or replaced by any of the other embodiments as appropriate.

(Embodiment 4)

Figure 12A:
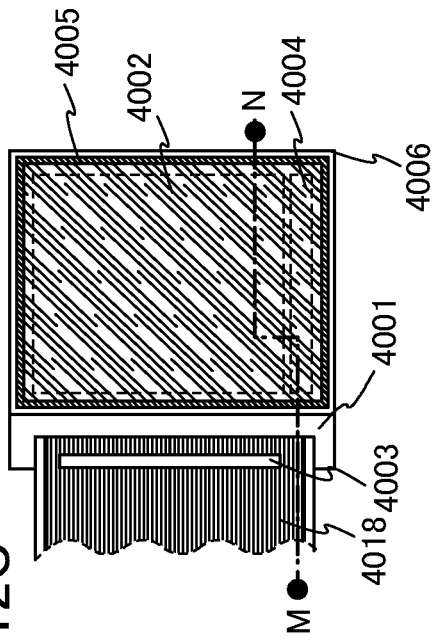
FIGS. 12A to 12C illustrate examples of the structure of a liquid crystal display device in Embodiment 4.
Figure 12C:
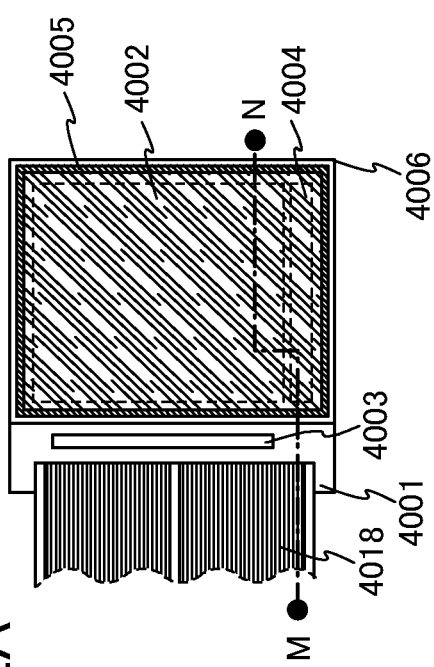
Figure 12B:
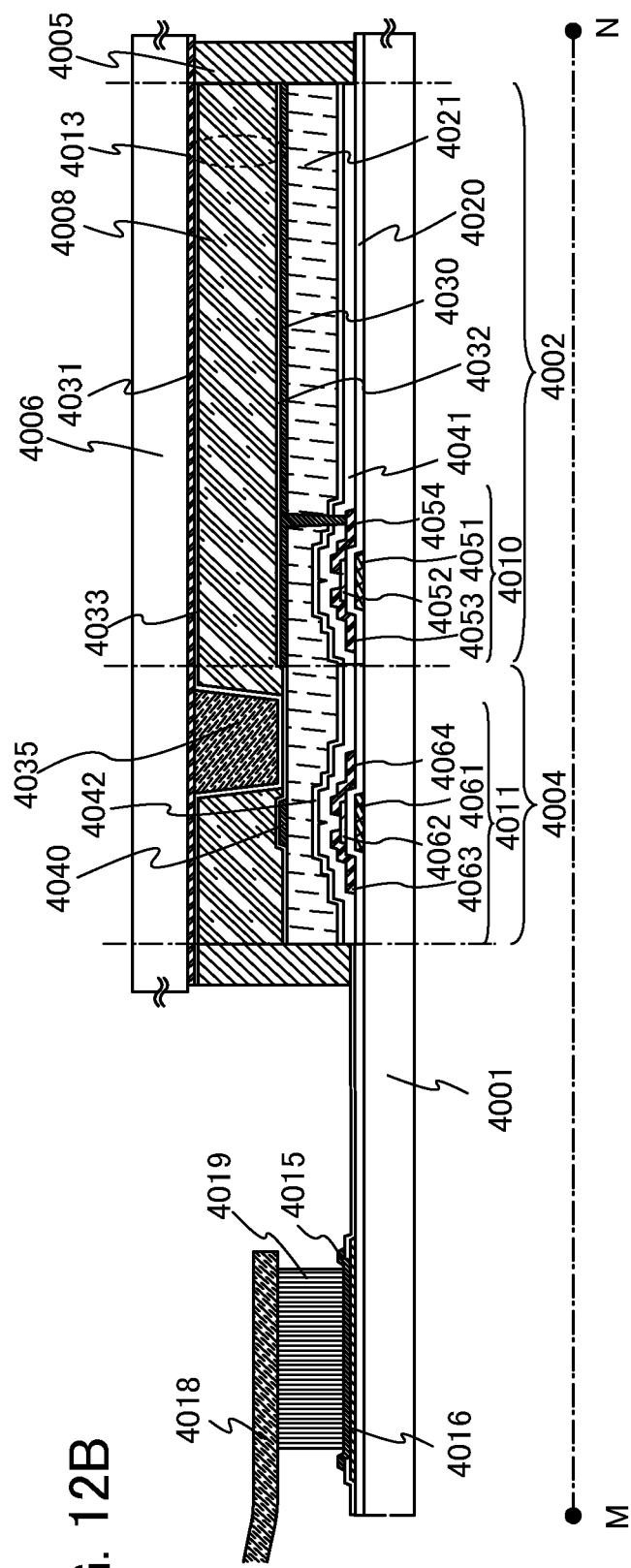

In this embodiment, an external appearance and a cross section of examples of the liquid crystal display device described in the above embodiment will be described with reference to FIGS. 12A to 12C. FIGS. 12A to 12C illustrate examples of the liquid crystal display device of this embodiment: FIG. 12A and FIG. 12C are plan views and FIG. 12B is a cross-sectional view along line M-N in FIG. 12A or FIG. 12C.

In the liquid crystal display devices illustrated in FIGS. 12A to 12C, a sealant 4005 is provided so as to surround a pixel portion 4002 and a scan line driver circuit 4004 which are provided over a first substrate 4001. In addition, a second substrate 4006 is provided over the pixel portion 4002 and the scan line driver circuit 4004. Thus, the pixel portion 4002 and the scan line driver circuit 4004 together with a liquid crystal layer 4008 are sealed between the first substrate 4001 and the second substrate 4006 with the sealant 4005. Further, in the liquid crystal display devices illustrated in FIGS. 12A to 12C, a signal line driver circuit 4003 which is formed using a single crystal semiconductor film or a polycrystalline semiconductor film over another substrate is mounted in a region that is different from the region surrounded by the sealant 4005 over the first substrate 4001.

There is no particular limitation on the connection method of a driver circuit which is separately formed; a COG method, a wire bonding method, a TAB method, or the like can be used. FIG. 12A illustrates an example in which the signal line driver circuit 4003 is mounted by a COG method, and FIG. 12C illustrates an example in which the signal line driver circuit 4003 is mounted by a TAB method.

Each of the pixel portion 4002 and the scan line driver circuit 4004 which are provided over the first substrate 4001 includes a plurality of transistors. In FIG. 12B, a transistor 4010 included in the pixel portion 4002 and a transistor 4011 included in the scan line driver circuit 4004 are illustrated as an example. Insulating layers 4041, 4042, and 4021 are provided over the transistors 4010 and 4011.

As the transistors 4010 and 4011, a transistor including an oxide semiconductor layer functioning as a channel formation layer can be used like the liquid crystal display device of Embodiment 1; for example, the transistor described in Embodiment 3 can be used.

The transistor 4010 includes a gate electrode layer 4051, a gate insulating layer 4020 provided over the gate electrode layer 4051, an oxide semiconductor layer 4052 provided over the gate electrode layer 4051 with the gate insulating layer 4020 provided therebetween, and a source electrode layer 4053 and a drain electrode layer 4054 provided over the oxide semiconductor layer 4052.

The transistor 4011 includes a gate electrode layer 4061, the gate insulating layer 4020 provided over the gate electrode layer 4061, an oxide semiconductor layer 4062 provided over the gate electrode layer 4061 with the gate insulating layer 4020 provided therebetween, and a source electrode layer 4063 and a drain electrode layer 4064 provided over the oxide semiconductor layer 4062.

A conductive layer 4040 is provided over the insulating layer 4021 so as to overlap with a channel formation region of the oxide semiconductor layer 4062 in the transistor 4011. The provision of the conductive layer 4040 so as to overlap with the channel formation region of the oxide semiconductor layer 4062 enables a reduction of the amount of shift in the threshold voltage of the transistor 4011 in a BT test. The voltage of the conductive layer 4040 may be the same as or different from that of the gate electrode layer 4061 of the transistor 4011 and the conductive layer 4040 can function as a second gate electrode layer. The potential of the conductive layer 4040 may be a ground potential or 0V, or the conductive layer 4040 may be in a floating state. The conductive layer 4040 need not necessarily be provided.

A pixel electrode layer 4030 is provided so as to be electrically connected to the source electrode layer 4053 or the drain electrode layer 4054 of the transistor 4010 through an opening in the insulating layers 4041, 4042, and 4021. A counter electrode layer 4031 is provided on the second substrate 4006. A portion where the pixel electrode layer 4030, the counter electrode layer 4031, and the liquid crystal layer 4008 overlap with one another corresponds to a liquid crystal element 4013. The pixel electrode layer 4030 and the counter electrode layer 4031 are provided with an insulating layer 4032 and an insulating layer 4033 serving as alignment films, respectively, and the liquid crystal layer 4008 is sandwiched between the pixel electrode layer 4030 and the counter electrode layer 4031 with the insulating layers 4032 and 4033 provided therebetween.

A light-transmitting substrate can be used as the first substrate 4001 and the second substrate 4006; glass, ceramics, or plastics can be used. As the plastics, a fiberglass-reinforced plastics (FRP) plate, a polyvinyl fluoride (PVF) film, a polyester film, or an acrylic resin film can be used.

A spacer 4035 is provided between the insulating layers 4032 and 4033. The spacer 4035 is a partition wall obtained by selective etching of an insulating film, and is provided in order to control the distance (cell gap) between the pixel electrode layer 4030 and the counter electrode layer 4031. A spherical spacer may be used as the spacer 4035.

The counter electrode layer 4031 is electrically connected to a common voltage line provided over the same substrate as the transistor 4010. The counter electrode layer 4031 can be electrically connected to the common voltage line with the use of a connection portion with the common voltage line (also referred to as a common connection portion), via conductive particles arranged between the pair of substrates.

The sealant 4005 contains conductive particles.

In the liquid crystal display devices of this embodiment, a liquid crystal showing a blue phase for which an alignment film is not needed may be used as a liquid crystal material of the liquid crystal layer 4008. The blue phase is one of the liquid crystal phases, which appears just before a cholesteric phase changes into an isotropic phase while the temperature of the cholesteric liquid crystal is increased. Since the blue phase appears only within a narrow range of temperatures, a liquid crystal composition containing a chiral agent at 5 wt % or more is used as a liquid crystal material in order to widen the temperature range. The liquid crystal composition which contains a liquid crystal showing a blue phase and a chiral agent has a short response time of 1 msec or less and has optical isotropy, which makes the alignment process unnecessary, and the viewing-angle dependence is small. In addition, since an alignment film does not need to be provided and rubbing treatment is also unnecessary, electrostatic discharge damage caused by the rubbing treatment can be prevented and defects and damage of the liquid crystal display device in the manufacturing process can be reduced. Thus, productivity of the liquid crystal display device can be increased. A transistor including an oxide semiconductor layer particularly has a possibility that electric characteristics of the transistor may fluctuate significantly due to static electricity and deviate from the design range. Therefore, by using a liquid crystal material showing a blue phase for the liquid crystal display device including a transistor including an oxide semiconductor layer, the fluctuation of electric characteristics due to static electricity can be reduced.

In the liquid crystal display devices of this embodiment, a polarizing plate may be provided on the outer side of the substrate (on the viewer side) and a coloring layer and an electrode layer used in a display element may be sequentially provided on the inner side of the substrate; alternatively, the polarizing plate may be provided on the inner side of the substrate. The stacked structure of the polarizing plate and the coloring layer may be set as appropriate in accordance with materials of the polarizing plate and the coloring layer and the condition of the manufacturing process. Further, a light-blocking layer serving as a black matrix may be provided in a portion other than the display portion.

The insulating layer 4041 is in contact with the oxide semiconductor layers 4052 and 4062. A silicon oxide layer can be used as the insulating layer 4041, for example.

The insulating layer 4042 is provided on and in contact with the insulating layer 4041. A silicon nitride layer can be used as the insulating layer 4042, for example.

The insulating layer 4021 is provided over the insulating layer 4042. The insulating layer 4021 functions as a planarization insulating layer for reducing roughness of a surface of the transistor. An organic material having heat resistance, such as polyimide, an acrylic resin, a benzocyclobutene-based resin, polyamide, or an epoxy resin can be used for the insulating layer 4021. Other than such organic materials, it is also possible to use a low-dielectric constant material (a low-k material), a siloxane-based resin, PSG (phosphosilicate glass), BPSG (borophosphosilicate glass), or the like. The insulating layer 4021 may be formed by stacking a plurality of insulating films formed of these materials.

There is no particular limitation on the formation method of the insulating layer 4021. Depending on the material, the following method can be used: a sputtering method, an SOG method, a spin coating method, a dipping method, a spray coating method, a droplet discharge method (e.g., an ink-jet method, a screen printing method, or an offset printing method), a formation method with a doctor knife, a formation method with a roll coater, a formation method with a curtain coater, a formation method with a knife coater, or the like.

The pixel electrode layer 4030 and the counter electrode layer 4031 can be formed using a layer of a light-transmitting conductive material such as indium tin oxide, a metal oxide in which zinc oxide is mixed in indium oxide (referred to as indium zinc oxide (IZO)), a conductive material in which silicon oxide ($SiO_2$) is mixed in indium oxide, organoindium, organotin, indium oxide containing tungsten oxide, indium zinc oxide containing tungsten oxide, indium oxide containing titanium oxide, indium tin oxide containing titanium oxide, or the like. In the case where the liquid crystal display device of this embodiment is formed to be a reflective type, a layer of a metal such as tungsten, molybdenum, zirconium, hafnium, vanadium, niobium, tantalum, chromium, cobalt, nickel, titanium, platinum, aluminum, copper, or silver or an alloy of such a metal can be used as the pixel electrode layer 4030 and the counter electrode layer 4031. The pixel electrode layer 4030 and the counter electrode layer 4031 can also be formed by stacking layers of materials which can be applied to the pixel electrode layer 4030 and the counter electrode layer 4031.

A conductive composition containing a conductive high molecule (also referred to as a conductive polymer) can be used for the pixel electrode layer 4030 and the counter electrode layer 4031. The electrode layer formed using the conductive composition preferably has a sheet resistance of less than or equal to 10000 ohms per square and a transmittance of 70% or higher at a wavelength of 550 nm Furthermore, the resistivity of the conductive high molecule contained in the conductive composition is preferably 0.1Ω·cm or less.

As the conductive high molecule, a so-called π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Further, a variety of signals and voltages are supplied to the signal line driver circuit 4003 which is separately formed, the scan line driver circuit 4004, or the pixel portion 4002 from an FPC 4018. The FPC 4018 is electrically connected to a terminal electrode 4016 through a connection terminal electrode 4015 and an anisotropic conductive film 4019.

The connection terminal electrode 4015 is formed using the same conductive film as the pixel electrode layer 4030 of the liquid crystal element 4013, and the terminal electrode 4016 is formed using the same conductive film as the source electrode layer 4053 or the drain electrode layer 4054 of the transistor 4010.

The connection terminal electrode 4015 is electrically connected to a terminal included in the FPC 4018 via an anisotropic conductive film 4019.

Although FIGS. 12A to 12C illustrate an example in which the signal line driver circuit 4003 is formed separately and mounted on the first substrate 4001; however, one embodiment of the present invention is not limited to this structure. The scan line driver circuit may be separately formed and then mounted, or only part of the signal line driver circuit or part of the scan line driver circuit may be separately formed and then mounted.

Further, a black matrix (a light-blocking layer); an optical member (an optical substrate) such as a polarizing member, a retardation member, or an anti-reflection member; or the like can be provided as appropriate for the liquid crystal display devices illustrated in FIGS. 12A to 12C. For example, circular polarization may be obtained by using a polarizing substrate and a retardation substrate as the optical member. In addition, a backlight or the like may be used as a light source.

In an active matrix liquid crystal display device, display patterns are formed on a screen by driving pixel electrodes arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

Further alternatively, in order to improve moving-image characteristics of a liquid crystal display device, a driving technique may be employed in which a plurality of LED (light-emitting diode) light sources or a plurality of EL light sources is used to form a surface light source as a backlight, and each light source of the surface light source is independently driven in a pulsed manner in one frame period. As the surface light source, three or more kinds of LEDs may be used, or an LED that emits white light may be used. Since a plurality of LEDs can be controlled independently, the light emission timing of the LEDs can be synchronized with the timing at which a liquid crystal layer is optically modulated. In this driving technique, part of LEDs can be turned off, so that especially in the case of displaying an image in which the proportion of a black image area in one screen is high, power consumption can be reduced.

By combining such a driving technique, the display characteristics of the liquid crystal display device described in the above embodiment can be improved.

Since the transistor is easily broken due to static electricity or the like, it is preferable that a protective circuit be provided over the same substrate as the pixel portion and the driver circuit portion. The protective circuit is preferably formed using a non-linear element including an oxide semiconductor layer. For example, protective circuits are provided between the pixel portion and a scan line input terminal and between the pixel portion and a signal line input terminal. In this embodiment, a plurality of protective circuits is provided so that the transistor in the pixel and the like are not broken when a surge voltage due to static electricity or the like is applied to a scan line, a signal line, or a capacitor bus line. Therefore, the protective circuit is formed so that charge is released to a common wiring when a surge voltage is applied to the protective circuit. Further, the protective circuit includes a non-linear element arranged in parallel to the scan line. The non-linear element includes a two-terminal element such as a diode or a three-terminal element such as a transistor. For example, the non-linear element can be formed through the same process as the transistor in the pixel portion. For example, characteristics similar to those of a diode can be obtained by connecting a gate to a drain of the non-linear element.

As a display mode of the liquid crystal display device of this embodiment mode, the following can be used: a twisted nematic (TN) mode, an in-plane-switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like. The display mode is not limited to those described above, and a fringe field switching mode or the like may also be used.

For the liquid crystal display device of this embodiment, a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. The liquid crystal display device of this embodiment is preferably a normally-black liquid crystal display device, for example, a transmissive liquid crystal display device employing a vertical alignment (VA) mode. Some examples can be given as the vertical alignment mode; for example, an MVA (multi-domain vertical alignment) mode, a PVA (patterned vertical alignment) mode, an ASV mode, or the like can be employed.

In this manner, the liquid crystal display device of this embodiment can be manufactured. With the structure of the liquid crystal display device described in this embodiment, power consumption can be reduced.

This embodiment can be combined with or replaced by any of the other embodiments as appropriate.

(Embodiment 5)

In this embodiment, a liquid crystal display device added with a touch panel function will be described as an example of the liquid crystal display device described in the above embodiment.

Figure 13A:
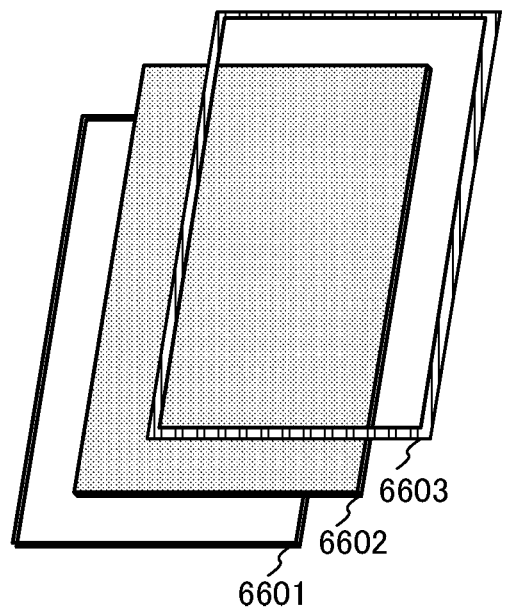
FIGS. 13A and 13B illustrate examples of the structure of a liquid crystal display device in Embodiment 5.
Figure 13B:
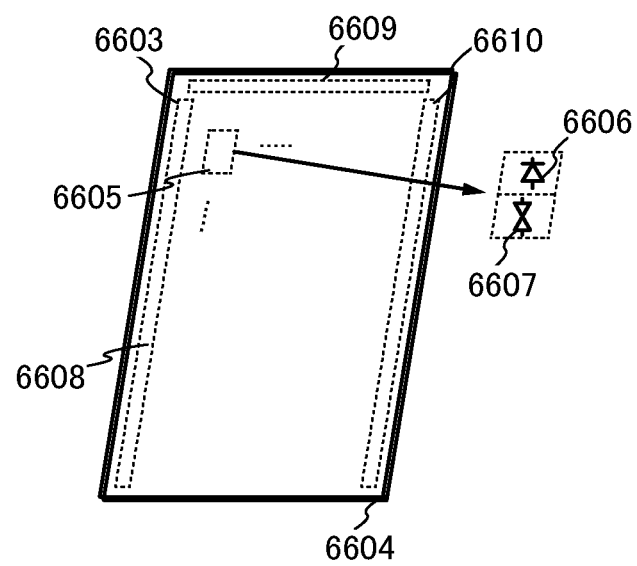

A structure of the liquid crystal display device of this embodiment will be described with reference to FIGS. 13A and 13B. FIGS. 13A and 13B illustrate examples of the structure of the liquid crystal display device of this embodiment.

A liquid crystal display device illustrated in FIG. 13A includes a liquid crystal display unit 6601 and a touch panel unit 6602 which is provided so as to overlap with the liquid crystal display unit 6601. The liquid crystal display unit 6601 and the touch panel unit 6602 are attached to each other with a housing (case) 6603.

The liquid crystal display device described in the above embodiment can be applied to the liquid crystal display unit 6601.

As the touch panel unit 6602, a resistive touch panel, a surface capacitive touch panel, or a projected capacitive touch panel can be used, for example.

As illustrated in FIG. 13A, one example of the liquid crystal display device of this embodiment has a structure in which a liquid crystal display unit and a touch panel unit which are separately manufactured overlap with each other. With this structure, manufacturing cost of the liquid crystal display device added with a touch panel function can be reduced.

A liquid crystal display device 6604 illustrated in FIG. 13B includes a plurality of pixels 6605 in a display portion, and each pixel 6605 includes a photosensor 6606 and a liquid crystal element 6607. The liquid crystal display device 6604 illustrated in FIG. 13B performs sensing in the follow manner: an object for being sensed (e.g., a finger or a pen) is moved to touch or be close to the photosensor 6606 in the pixel 6605, and photocurrent is generated with the photosensor 6606 in accordance with reflected light from the object. The liquid crystal display device 6604 illustrated in FIG. 13B need not, unlike the liquid crystal display device illustrated in FIG. 13A, involve an overlap of the touch panel unit 6602, so that the thickness of the liquid crystal display device can be reduced. Further, in addition to the pixel portion 6605, a scan line driver circuit 6608, a signal line driver circuit 6609, and a photosensor driver circuit 6610 can be formed over the same substrate as the pixel portion 6605, whereby the liquid crystal display device can be downsized. The photosensor 6606 may be formed using amorphous silicon or the like and overlapped with a transistor including an oxide semiconductor.

By using a transistor including an oxide semiconductor layer functioning as a channel formation layer in the liquid crystal display device added with a touch panel function of this embodiment, the display device can display a still image for a long period of time. Further, the operation of the driver circuit portion can be stopped during a period in which a still image is displayed, whereby power consumption can be reduced.

This embodiment can be combined with or replaced by any of the other embodiments as appropriate.

(Embodiment 6)

In this embodiment, an electronic book reader will be described as an example of the liquid crystal display device described in the above embodiment.

An electronic book reader of this embodiment will be described with reference to FIG. 14. FIG. 14 illustrates an example of the electronic book reader of this embodiment.

The electronic book reader illustrated in FIG. 14 includes two housings, a housing 2701 and a housing 2703. The housings 2701 and 2703 are connected by a hinge portion 2711 and can be opened or closed using the hinge portion 2711 as an axis. With such a structure, the electronic book reader can operate like a paper book.

A display portion 2705 and a display portion 2707 are incorporated in the housing 2701 and the housing 2703, respectively. The display portion 2705 and the display portion 2707 may display different images. One image may be displayed across the display portion 2705 and the display portion 2707. In the case of displaying different images, text can be displayed on a display portion on the right side (the display portion 2705 in FIG. 14) and graphics can be displayed on a display portion on the left side (the display portion 2707 in FIG. 14), for example.

The example of the electronic book reader illustrated in FIG. 14 is provided with an operation portion and the like in the housing 2701. For example, the housing 2701 is provided with a power switch 2721, an operation key 2723, a speaker 2725, and the like. With the operation key 2723, pages can be turned. Further, a keyboard, a pointing device, or the like may also be provided on the same plane as the display portion of the housing. In addition, an external connection terminal (an earphone terminal, a USB terminal, a terminal connectable to a variety of cables such as an AC adapter and a USB cable, or the like), a recording medium insertion portion, and the like may be provided on the rear surface or the side surface of the housing. Further, a function of an electronic dictionary may be provided for the electronic book reader illustrated in FIG. 14.

The electronic book reader of this embodiment may transmit and receive data wirelessly. Through wireless communication, book data or the like can be purchased and downloaded from an electronic book server.

The electronic book reader of this embodiment may have a power supply circuit including a solar battery cell, a power storage device for charging voltage that is output from the solar battery cell, and a DC converter for converting a voltage charged in the power storage device into respective voltages appropriate for circuits. Accordingly, an external power supply is not needed, and thus the electronic book reader can be used for a long period of time even at a place with no external power supply, so that convenience can be improved. As the power storage device, one or more of a lithium ion secondary battery, a lithium ion capacitor, an electric double-layer capacitor, a redox capacitor, and the like can be used. For example, a lithium ion secondary battery and a lithium ion capacitor can be used together, whereby a power storage device which can charge or discharge at high speed and can supply electric power for a long time can be formed. The power storage device is not limited to the lithium ion secondary battery. As the power storage device, a secondary battery in which another alkali metal ion, alkaline earth metal ion, or the like is used as a mobile ion may be used. There is no limitation also on the lithium ion capacitor. As the power storage device, a capacitor in which another alkali metal ion, alkaline earth metal ion, or the like is used as a mobile ion may be used.

By using a transistor including an oxide semiconductor layer functioning as a channel formation layer in the electronic book reader of this embodiment, the display device can display a still image for a long period of time, which is particularly effective in the case where a certain still image on an electronic book reader is viewed for a long period of time. Further, the operation of the driver circuit portion can be stopped during a period in which a still image is displayed, whereby power consumption can be reduced.

This embodiment can be combined with or replaced by any of the other embodiments as appropriate.

(Embodiment 7)

In this embodiment, electronic devices which have the liquid crystal display device described in the above embodiment in their display portions will be described.

By applying the liquid crystal display device described in the above embodiment to display portions of a variety of electronic devices, the electronic devices can have a variety of functions in addition to a display function. Specific examples of the electronic device in which the liquid crystal display device described of the above embodiment is applied to a display portion will be described with reference to FIGS. 15A to 15F. FIGS. 15A to 15F each illustrate an example of the structure of the electronic device of this embodiment.

Figure 15A:
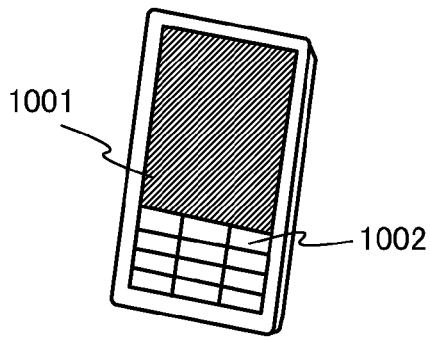
FIGS. 15A to 15F illustrate examples of the structure of a liquid crystal display device in Embodiment 7.

FIG. 15A illustrates a personal digital assistant. The personal digital assistant illustrated in FIG. 15A includes at least a display portion 1001. The personal digital assistant illustrated in FIG. 15A can be combined with a touch panel or the like for example, and can be used as an alternative to a variety of portable objects. For example, the display portion 1001 is provided with an operation portion 1002, so that the personal digital assistant can be used as a mobile phone. The operation portion 1002 is not necessarily provided in the display portion 1001, and additional operation buttons may be provided. Moreover, the personal digital assistant can be used as a notepad or used as a handy scanner by using a document input-output function. Further, the liquid crystal display device described in the above embodiment can realize long intervals between writing operations since a display period by one image-data writing is long. Therefore, by using the liquid crystal display device described in the above embodiment for the personal digital assistant illustrated in FIG. 15A, even in the case where a person views images on the display portion for a long period of time for example, the level of eye fatigue caused can be made lower.

Figure 15B:
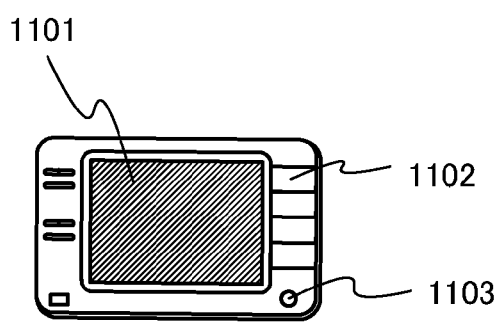

FIG. 15B illustrates an information guide terminal including an automotive navigation system, for example. The information guide terminal illustrated in FIG. 15B has at least a display portion 1101, and can also have operation buttons 1102, an external input terminal 1103, and the like. The in-car temperature changes greatly in accordance with the outside-air temperature, and sometimes exceed 50° C. Since characteristic change due to the temperature of the liquid crystal display device described in the above embodiment is small, the liquid crystal display device described in the above embodiment is particularly effective under circumstances where the temperature greatly changes such as the inside of a car.

Figure 15C:
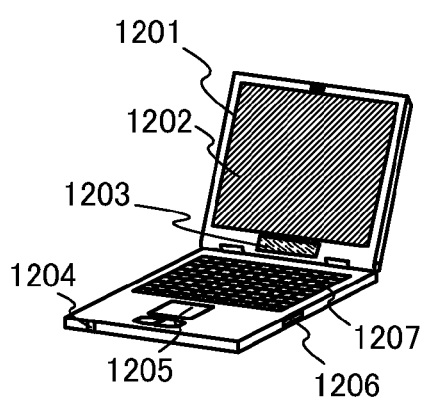

FIG. 15C illustrates a laptop personal computer. The laptop personal computer illustrated in FIG. 15C includes a housing 1201, a display portion 1202, a speaker 1203, an LED lamp 1204, a pointing device 1205, a connection terminal 1206, and a keyboard 1207. The liquid crystal display device described in the above embodiment can realize long intervals between writing operations since a display period by one image-data writing is long. Therefore, by using the liquid crystal display device described in the above embodiment for the laptop personal computer illustrated in FIG. 15C, even in the case where a person views images on the display portion for a long period of time for example, the level of eye fatigue caused can be made lower.

Figure 15D:
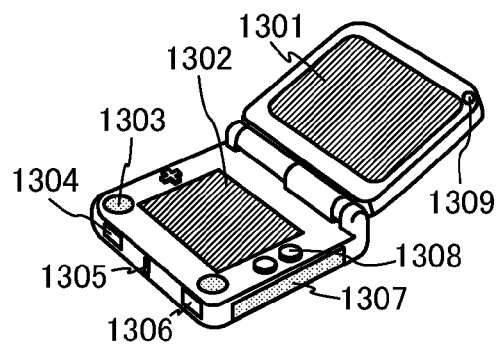

FIG. 15D illustrates a portable game machine. The portable game machine illustrated in FIG. 15D includes a first display portion 1301, a second display portion 1302, a speaker 1303, a connection terminal 1304, an LED lamp 1305, a microphone 1306, a recording medium reading portion 1307, operation buttons 1308, and a sensor 1309. Further, the liquid crystal display device described in the above embodiment can realize long intervals between writing operations since a display period by one image-data writing is long. Therefore, by using the liquid crystal display device described in the above embodiment for the portable game machine illustrated in FIG. 15D, even in the case where a person views images on the display portion for a long period of time for example, the level of eye fatigue caused can be made lower. Further, different images can be displayed on the first display portion 1301 and the second display portion 1302; for example, a moving image is displayed on one of them and a still image is displayed on the other. Accordingly, a signal or voltage supply to the driver circuit portion for the display portion where a still image is displayed can be stopped, whereby power consumption can be reduced.

Figure 15E:
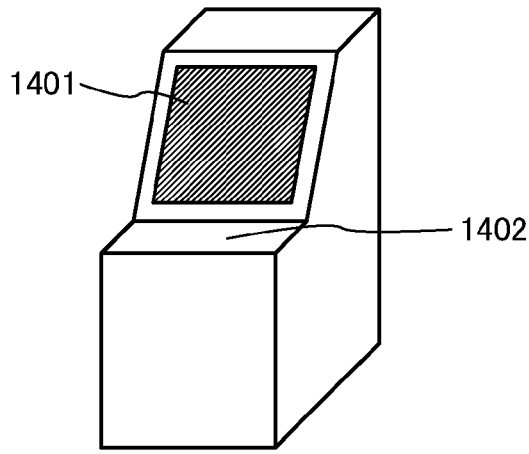

FIG. 15E illustrates a stationary information communication terminal. The stationary information communication terminal illustrated in FIG. 15E includes at least a display portion 1401. The display portion 1401 can also be provided on a plane portion 1402. Further, operation buttons or the like can be provided on the plane portion 1402. The stationary information communication terminal illustrated in FIG. 15E can be used as an automated teller machine or an information communication terminal (also referred to as a multimedia station) for ordering tickets (including a train ticket). The liquid crystal display device described in the above embodiment can realize long intervals between writing operations since a display period by one image-data writing is long. Therefore, by using the liquid crystal display device described in the above embodiment for the stationary information communication terminal illustrated in FIG. 15E, even in the case where a person views images on the display portion for a long period of time for example, the level of eye fatigue caused can be made lower.

Figure 15F:
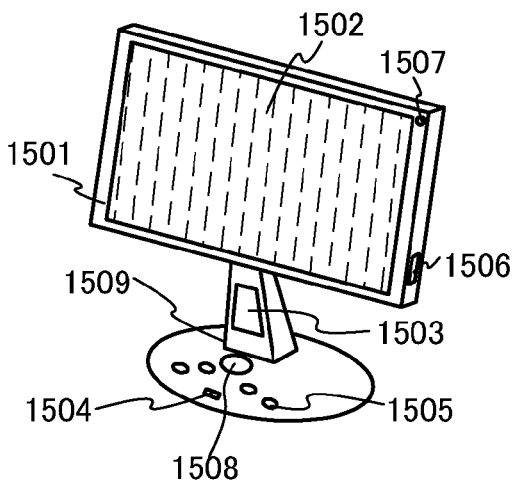

FIG. 15F illustrates a display. The display illustrated in FIG. 15F includes a housing 1501, a display portion 1502, a speaker 1503, an LED lamp 1504, operation buttons 1505, a connection terminal 1506, a sensor 1507, a microphone 1508, and a support base 1509. The liquid crystal display device described in the above embodiment can realize long intervals between writing operations since a display period by one image-data writing is long. Therefore, by using the liquid crystal display device described in the above embodiment for the display illustrated in FIG. 15F, even in the case where a person views images on the display portion for a long period of time for example, the level of eye fatigue caused can be made lower.

By applying the liquid crystal display device described in the above embodiment to display portions of electronic devices, multifunctional electronic devices can be provided.

This embodiment can be combined with or replaced by any of the other embodiments as appropriate.

This application is based on Japanese Patent Application serial no. 2010-010419 filed with Japan Patent Office on Jan. 20, 2010, the entire contents of which are hereby incorporated by reference.

EXPLANATION OF REFERENCE

10: pulse output circuit, 11: wiring, 12: wiring, 13: wiring, 14: wiring, 15: wiring, 17: wiring, 18: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 51: power supply line, 52: power supply line, 61: period, 62: period, 100: liquid crystal display device, 101: image processing circuit, 102: correction circuit, 111: memory circuit, 111b: frame memory, 112: comparison circuit, 113: display control circuit, 115: selection circuit, 120: display panel, 121: driver circuit portion, 122: pixel portion, 123: pixel, 124: scan line, 125: image signal line, 126: terminal portion, 127: transistor, 130: light source portion, 131: temperature detection circuit, 132: counting circuit, 133: counting value comparison circuit, 210: capacitor, 214: transistor, 215: liquid crystal element, 400a: substrate, 400b: substrate, 400c: substrate, 400d: substrate, 401a: gate electrode layer, 401b: gate electrode layer, 401c: gate electrode layer, 401d: gate electrode layer, 402a: gate insulating layer, 402b: gate insulating layer, 402c: gate insulating layer, 402d: gate insulating layer, 403a: oxide semiconductor layer, 403b: oxide semiconductor layer, 403c: oxide semiconductor layer, 403d: oxide semiconductor layer, 405a: source electrode layer, 405b: source electrode layer, 405c: source electrode layer, 405d: source electrode layer, 406a: drain electrode layer, 406b: drain electrode layer, 406c: drain electrode layer, 406d: drain electrode layer, 407a: oxide insulating layer, 407c: oxide insulating layer, 409a: protective insulating layer, 409b: protective insulating layer, 409c: protective insulating layer, 411: period, 412: period, 413: period, 414: period, 427: insulating layer, 436: wiring layer, 437: wiring layer, 447: base layer, 516: oxide insulating layer, 530: oxide semiconductor film, 601: period, 602: period, 603: period, 604: period, 1001: display portion, 1002: operation portion, 1101: display portion, 1102: operation buttons, 1103: external input terminal, 1201: housing, 1202: display portion, 1203: speaker, 1204: LED lamp, 1205: pointing device, 1206: connection terminal, 1207: keyboard, 121A: driver circuit, 121B: driver circuit, 1301: display portion, 1302: display portion, 1303: speaker, 1304: connection terminal, 1305: LED lamp, 1306: microphone, 1307: recording medium reading portion, 1308: operation buttons, 1309: sensor, 1401: display portion, 1402: plane portion, 1501: housing, 1502: display portion, 1503: speaker, 1504: LED lamp, 1505: operation buttons, 1506: connection terminal, 1507: sensor, 1508: microphone, 1509: support base, 2701: housing, 2703: housing, 2705: display portion, 2707: display portion, 2711: hinge portion, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: gate insulating layer, 4021: insulating layer, 4030: pixel electrode layer, 4031: counter electrode layer, 4032: insulating layer, 4033: insulating layer, 4035: spacer, 4040: conductive layer, 4041: insulating layer, 4042: insulating layer, 4051: gate electrode layer, 4052: oxide semiconductor layer, 4053: source electrode layer, 4054: drain electrode layer, 4061: gate electrode layer, 4062: oxide semiconductor layer, 4063: source electrode layer, 4064: drain electrode layer, 6505: pixel, 6601: liquid crystal display unit, 6602: touch panel unit, 6603: housing, 6604: liquid crystal display device, 6605: pixel, 6606: photosensor, 6607: liquid crystal element, 6608: scan line driver circuit, 6609: signal line driver circuit, and 6610: photosensor driver circuit.

The invention claimed is:

1. A method for driving a display device comprising the steps of:
supplying an image signal of a still image from a display control circuit to a driver circuit portion;
writing a data of the image signal from the driver circuit portion into a pixel;
after writing the data of the image signal, holding the data written into the pixel by stopping a supply of a signal for operating the driver circuit portion from the display control circuit to the driver circuit portion for a period; and
after the period, restarting the supply of the signal for operating the driver circuit portion from the display control circuit to the driver circuit portion to write the data of the image signal of the still image from the driver circuit portion into the pixel;
wherein a length of the period from a step of stopping the supply of the signal for operating the driver circuit portion to a step of restarting the supply of the signal for operating the driver circuit portion is set in accordance with a temperature of the display device detected by a temperature detection circuit in the display device, and
wherein the pixel is configured to display the still image in the period.

2. The method for driving a display device according to claim 1,
wherein the length of the period from the step of stopping the supply of the signal for operating the driver circuit portion to the step of restarting the supply of the signal for operating the driver circuit portion is set on a basis of a control signal generated using a data of the temperature detected by the temperature detection circuit.

3. The method for driving a display device according to claim 2,
wherein a supply of a start signal, a clock signal, and a power supply voltage from the display control circuit to the driver circuit portion is stopped when stopping the supply of the signal for operating the driver circuit portion to the driver circuit portion.

4. The method for driving a display device according to claim 2,
wherein a supply of a start signal, a clock signal, and a power supply voltage from the display control circuit to the driver circuit portion is restarted when restarting the supply of the signal for operating the driver circuit portion to the driver circuit portion.

5. The method for driving a display device according to claim 3,
wherein the supply of the start signal, the clock signal, and the power supply voltage from the display control circuit to the driver circuit portion is restarted when restarting the supply of the signal for operating the driver circuit portion to the driver circuit portion.

6. The method for driving a display device according to claim 1, wherein a supply of a start signal, a clock signal, and a power supply voltage from the display control circuit to the driver circuit portion is stopped when stopping the supply of the signal for operating the driver circuit portion to the driver circuit portion.

7. The method for driving a display device according to claim 6,
wherein the supply of the start signal, the clock signal, and the power supply voltage from the display control circuit to the driver circuit portion is restarted when restarting the supply of the signal for operating the driver circuit portion to the driver circuit portion.

8. The method for driving a display device according to claim 1,
wherein a supply of a start signal, a clock signal, and a power supply voltage from the display control circuit to the driver circuit portion is restarted when restarting the supply of the signal for operating the driver circuit portion to the driver circuit portion.

9. A liquid crystal display device comprising:
a display panel comprising a driver circuit portion and a pixel; and
a display control circuit configured to receive an image signal, a first control signal, a power supply voltage and a second control signal, and selectively start or stop an output of a start signal, an output of a clock signal, and an output of the power supply voltage to the display control circuit sequentially on a basis of the first control signal and the second control signal,
wherein the driver circuit portion is configured to receive the output of the image signal, the start signal, the clock signal, and the power supply voltage from the display control circuit,
wherein the pixel is configured to receive the image signal from the driver circuit portion,
wherein the first control signal is a signal based on the image signal, and
wherein the second control signal is a signal based on a temperature of the liquid crystal display device.

10. The liquid crystal display device according to claim 9,
wherein the pixel includes a liquid crystal element and a transistor which controls whether to output a data of the image signal to the liquid crystal element, and
wherein the transistor includes an oxide semiconductor layer which functions as a channel formation layer and has a carrier concentration of less than $1\times10^{14}/\text{cm}^3$.

11. A liquid crystal display device according to claim 9,
wherein the display control circuit is configured to selectively start or stop the output of the image signal, the output of the start signal, the output of the clock signal, and the output of the power supply voltage to the driver circuit portion sequentially on the basis of the first control signal and the second control signal.

12. The liquid crystal display device according to claim 9,
wherein the pixel includes a liquid crystal element and a transistor including an oxide semiconductor layer,
wherein the transistor is provided between an electrode of the liquid crystal element and a wiring which is configured to be supplied with the image signal, and
wherein an off-state current density per a channel width of 1 μm of the transistor is less than or equal to $1\times10^{-17}$ A.

13. A liquid crystal display device comprising:
a display panel comprising a driver circuit portion and a pixel;
a memory circuit configured to sequentially store a data of a first image signal and a data of a second image signal;
a comparison circuit configured to compare the data of the first image signal and the data of the second image signal to generate a first control signal;
a selection circuit configured to read out the data of a third image signal on a basis of the first control signal to output the data of the third image signal;
a correction circuit configured to detect a temperature of the liquid crystal display device to generate a second control signal; and
a display control circuit configured to receive a power supply voltage, the first control signal, the second control signal, and the third image signal, and selectively start or stop an output of the third image signal, an output of a start signal, an output of a clock signal, and an output of the power supply voltage to the driver circuit portion sequentially on a basis of the first control signal and the second control signal ,
wherein the driver circuit portion is configured to receive the output of the third image signal, the start signal, the clock signal, and the power supply voltage from the display control circuit,
wherein the pixel is configured to display an image corresponding to the third image signal,
wherein the first image signal and the second image signal are image signals in successive frame periods, and
wherein the third image signal is the first image signal or the second image signal.

14. The liquid crystal display device according to claim 13,
wherein the correction circuit comprising:
a temperature detection circuit configured to detect the temperature of the liquid crystal display device to generate a first count value in accordance with a detected temperature;
a counting circuit configured to count a number of successive frame periods corresponding to a still image to generate a second count value; and
a counting value comparison circuit configured to compare the first count value with the second count value to generate the second control signal based on a comparison result.

15. The liquid crystal display device according to claim 14,
wherein the pixel includes a liquid crystal element and a transistor which controls whether to output the data of the third image signal to the liquid crystal element, and
wherein the transistor includes an oxide semiconductor layer which functions as a channel formation layer and has a carrier concentration of less than $1\times10^{14}/\text{cm}^3$.

16. The liquid crystal display device according to claim 14,
wherein the pixel includes a liquid crystal element and a transistor including an oxide semiconductor layer,
wherein the transistor is provided between an electrode of the liquid crystal element and a wiring which is configured to be supplied with the third image signal, and
wherein an off-state current density per a channel width of 1 μm of the transistor is less than or equal to $1\times10^{-17}$ A.

17. The liquid crystal display device according to claim 13,
wherein the pixel includes a liquid crystal element and a transistor which controls whether to output the data of the third image signal to the liquid crystal element, and
wherein the transistor includes an oxide semiconductor layer which functions as a channel formation layer and has a carrier concentration of less than $1\times10^{14}/\text{cm}^3$.

18. The liquid crystal display device according to claim 13,
wherein the pixel includes a liquid crystal element and a transistor including an oxide semiconductor layer, wherein the transistor is provided between an electrode of the liquid crystal element and a wiring which is configured to be supplied with the third image signal, and wherein an off-state current density per a channel width of 1 μm of the transistor is less than or equal to $1\times10^{-17}$ A.

19. A liquid crystal display device comprising:
a display panel comprising a driver circuit portion and a pixel;
a memory circuit configured to sequentially store a data of a first image signal and a data of a second image signal;
a comparison circuit configured to compare the data of the first image signal and the data of the second image signal to generate a first control signal;
a selection circuit configured to read out the data of the first image signal to output the first image signal;
a correction circuit configured to detect a temperature of the liquid crystal display device to generate a second control signal; and
a display control circuit configured to receive a power supply voltage, the first control signal, the second control signal, and the first image signal, and sequentially stop an output of a start signal, an output of a clock signal, and an output of the power supply voltage to the driver circuit portion,
wherein the driver circuit portion is configured to stop an operation while the display control circuit stops at least one of the output of the start signal, the output of the clock signal, and the output of the power supply voltage to the driver circuit portion,
wherein the pixel is configured to display an image corresponding to the first image signal while the display control circuit stops the output of the start signal, the output of the clock signal, and the output of the power supply voltage to the driver circuit portion, and
wherein the first image signal and the second image signal are image signals in successive frame periods.

20. The liquid crystal display device according to claim 19,
wherein the display control circuit is configured to sequentially stop the output of the first image signal, the output of the start signal, the output of the clock signal, and the output of the power supply voltage to the driver circuit portion;
wherein the driver circuit portion is configured to stop the operation while the display control circuit stops the output of the first image signal, the output of the start signal, the output of the clock signal, and the output of the power supply voltage to the driver circuit portion; and
wherein the pixel is configured to display the image corresponding to the first image signal while the display control circuit stops the output of the first image signal, the output of the start signal, the output of the clock signal, and the output of the power supply voltage to the driver circuit portion.

21. A method for driving a display device comprising an image processing circuit, a display control circuit, a correction circuit, a driver circuit and a pixel, the method comprising the steps of:
outputting a first signal from the image processing circuit, the first signal including data for displaying a still image;
outputting a second signal from the correction circuit, the second signal including data of a length of a holding period of the still image;
inputting the first signal and the second signal to the display control circuit;
outputting a third signal from the display control circuit, the third signal including data for displaying the still image,
inputting the third signal to the driver circuit,
outputting a fourth signal from the driver circuit, the fourth signal including data for displaying the still image,
inputting the fourth signal to the pixel and then holding the fourth signal input to the pixel during the holding period whereby the still image is displayed during the holding period,
wherein the display control circuit stops a supply of a power supply voltage to the driver circuit during the holding period, and
wherein the length of the holding period is set based on a temperature of the display device detected by the correction circuit.

22. The method for driving a display device according to claim 21,
wherein the display control circuit restarts the supply of the power supply voltage to the driver circuit after the holding period.

* * * * *

UNITED STATES PATENT AND TRADEMARK OFFICE
CERTIFICATE OF CORRECTION

| | | |
|---|---|---|
| PATENT NO. | : 8,817,009 B2 | Page 1 of 1 |
| APPLICATION NO. | : 13/005763 | |
| DATED | : August 26, 2014 | |
| INVENTOR(S) | : Masahiko Hayakawa et al. | |

It is certified that error appears in the above-identified patent and that said Letters Patent is hereby corrected as shown below:

In the Specification

At column 11, line 58, "$InMO_3(ZnO)$," should be --$InMO_3(ZnO)_m$--;

At column 12, line 38, "Vice)." should be --Vce).--;

At column 17, line 44, "10N." should be --10_N.--.

Signed and Sealed this
Third Day of February, 2015

Michelle K. Lee
*Deputy Director of the United States Patent and Trademark Office*